United States Patent
Shibata et al.

(10) Patent No.: US 10,636,931 B1
(45) Date of Patent: Apr. 28, 2020

(54) ELECTRONIC DEVICE

(71) Applicant: InnoLux Corporation, Miao-Li County (TW)

(72) Inventors: Junya Shibata, Miao-Li County (TW); Toshiya Inada, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/174,978

(22) Filed: Oct. 30, 2018

(51) Int. Cl.
| | |
|---|---|
| H01L 31/113 | (2006.01) |
| H01L 27/146 | (2006.01) |
| H01L 31/02 | (2006.01) |
| H01L 31/0216 | (2014.01) |
| H01L 31/0368 | (2006.01) |
| H01L 31/0376 | (2006.01) |
| H01L 31/103 | (2006.01) |
| G06K 9/00 | (2006.01) |
| G02F 1/1368 | (2006.01) |
| G02F 1/1362 | (2006.01) |

(52) U.S. Cl.
CPC .... *H01L 31/1136* (2013.01); *H01L 27/14678* (2013.01); *H01L 31/02019* (2013.01); *H01L 31/02164* (2013.01); *H01L 31/03682* (2013.01); *H01L 31/03762* (2013.01); *H01L 31/1032* (2013.01); *G02F 1/1368* (2013.01); *G02F 1/13624* (2013.01); *G02F 1/136286* (2013.01); *G02F 2001/13685* (2013.01); *G02F 2202/103* (2013.01); *G02F 2202/104* (2013.01); *G06K 9/0004* (2013.01)

(58) Field of Classification Search
CPC .......... H01L 31/1136; H01L 31/02164; H01L 2924/13092; H01L 2924/10385; H01L 27/1251; G02F 221/13685
See application file for complete search history.

(56) References Cited

U.S. PATENT DOCUMENTS

| | | | |
|---|---|---|---|
| 9,147,719 B2 * | 9/2015 | Kim | H01L 27/326 |
| 2007/0206113 A1 | 9/2007 | Nakamura et al. | |
| 2010/0127254 A1 | 5/2010 | Lai et al. | |
| 2017/0148817 A1 * | 5/2017 | Shi | H01L 29/78648 |

FOREIGN PATENT DOCUMENTS

CN 104573648 A 4/2015

* cited by examiner

*Primary Examiner* — Hsien Ming Lee
(74) *Attorney, Agent, or Firm* — McClure, Qualey & Rodack, LLP

(57) ABSTRACT

An electronic device includes a plurality of double gate thin film transistors (DGTFT). The plurality of DGTFTs includes a first DGTFT, the first DGTFT includes a substrate, a first transparent conductive layer disposed above the substrate, and a first metal layer. The first metal layer is disposed corresponding to the first transparent conductive layer. The first metal layer is electrically connected to the first transparent conductive layer.

17 Claims, 17 Drawing Sheets

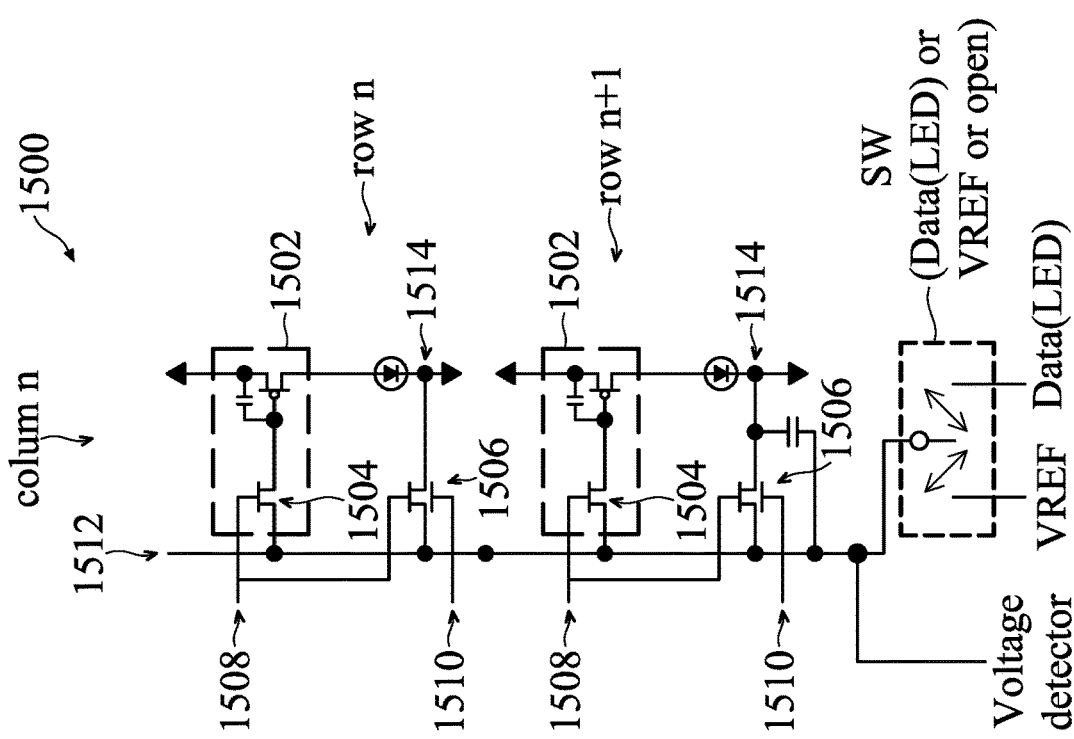
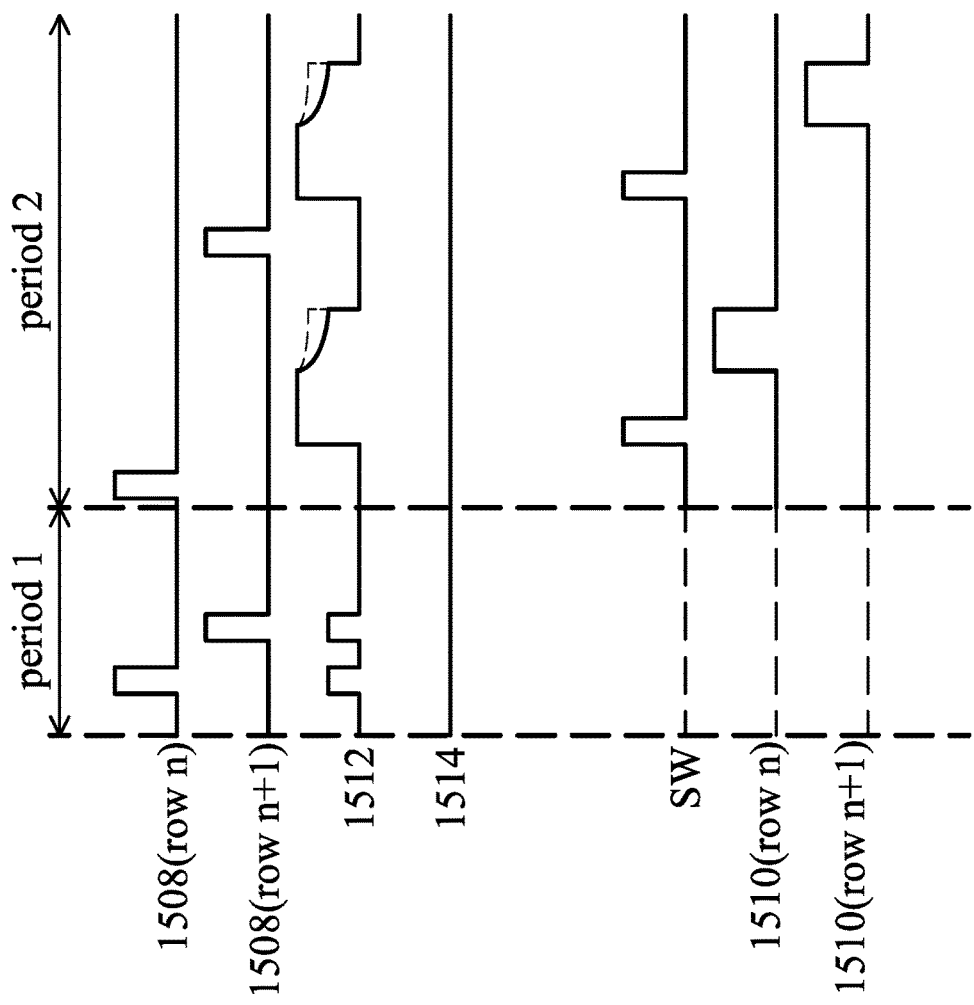
FIG. 16A
FIG. 16B

ELECTRONIC DEVICE

BACKGROUND OF THE INVENTION

Field of the Invention

The present disclosure relates to an electronic device, and in particular to an electronic device having at least one first double gate thin film transistors (DGTFTs) with a metal layer electrically connected to a transparent conductive layer.

Description of the Related Art

In an electronic device, such as a photo sensor device, a plurality of double gate type transistors (e.g., double gate thin-film transistor, DGTFT) are arranged in an array to sense light or images (e.g., a fingerprint pattern). In the conventional structure of a double gate type transistor, a transparent electrode material is applied as a top gate electrode to radiate light to the semiconductor layer.

However, recently, photo sensor devices require high voltage level resolution and more accurate identification. Such top gate electrodes could have high voltage level resistance and may cause a circuit operation delay and variations in photo data in each photo sensing area of the photo sensor device. In addition, the photo sensing area may be exposed not just by light reflected from an object, but also by stray light coming from other directions. Furthermore, when there are respective variations in the characteristics of the double gate type transistor of each pixel in the photo sensing area, it could also cause data variations. Conventional photo sensor devices using a double gate type transistor output analog data, so it's easy to be influenced by those variations.

BRIEF SUMMARY

The present disclosure provides an electronic device that comprises a plurality of double gate thin film transistors (DGTFT). The plurality of the DGTFTs comprises a first DGTFT, the first DGTFT includes a substrate, a first transparent conductive layer disposed above the substrate, and a first metal layer. The first metal layer is disposed corresponding to the first transparent conductive layer. The first metal layer is electrically connected to the first transparent conductive layer.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. It should be understood that these drawings depict only exemplary aspects of the disclosure and are therefore not to be considered to be limiting of its scope. The principles herein are described and explained with additional specificity and detail through the use of the accompanying drawings, in which:

FIG. 16A illustrates a portion of the full array of the OLED, in accordance with some embodiments of the present disclosure.

FIG. 16B is a timing diagram of the photo sensing of the array in FIG. 16A, in accordance with some embodiments of the present disclosure.

DETAILED DESCRIPTION

Figure 1A:
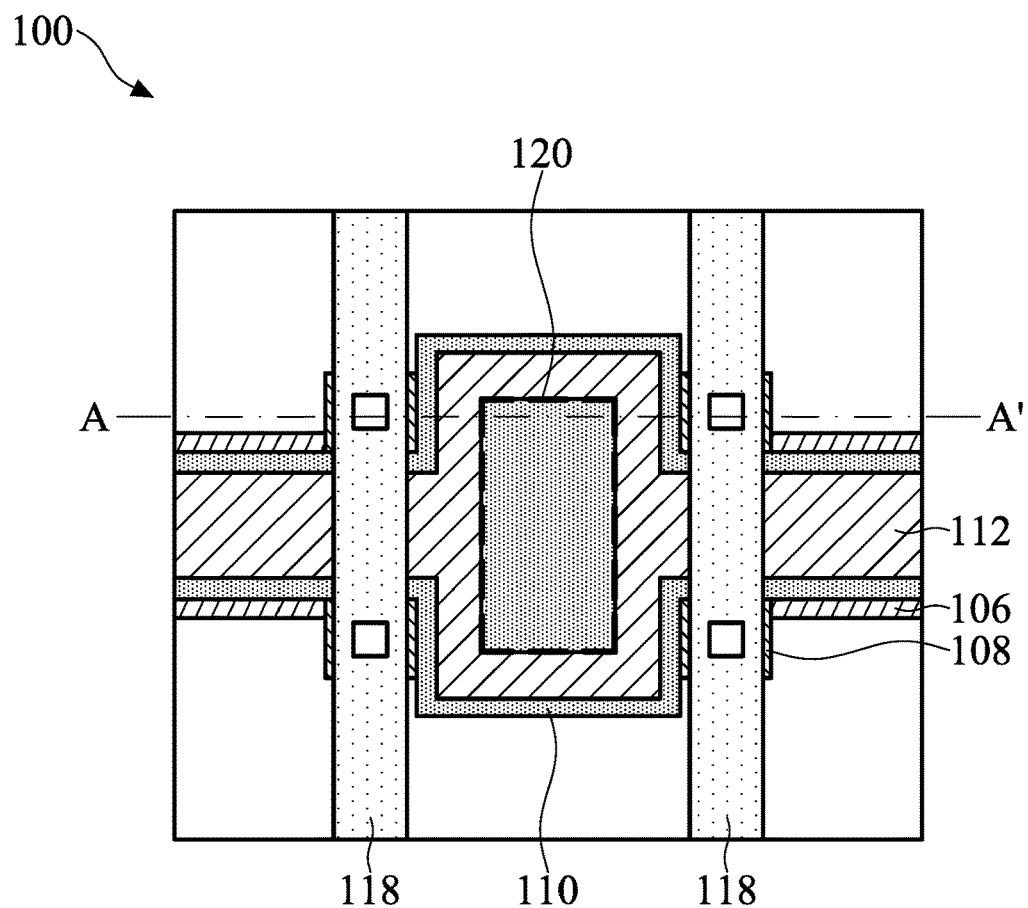
FIG. 1A illustrates a top view (layout) of a double gate thin-film transistor (DGTFT) in an electronic device, in according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

For convenience, the "corresponding to" represents one element could be disposed above/under the other element, or the two elements could be at least partially overlapped in a top view.

Figure 1B:
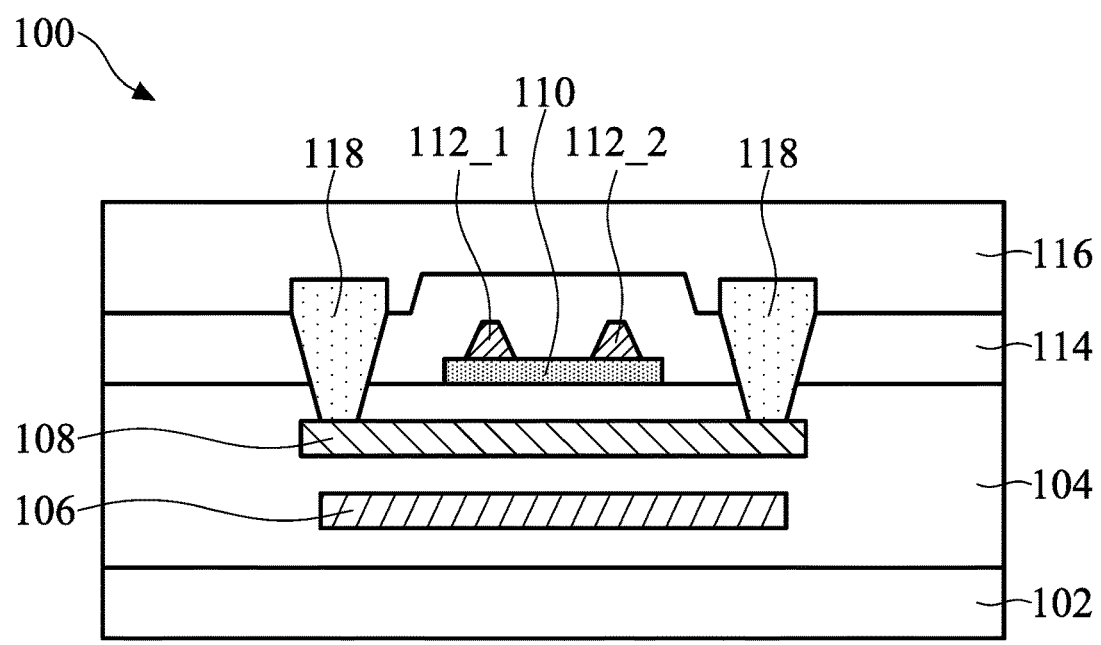
FIG. 1B illustrates a cross-sectional view of the double gate type transistor taken along line A-A' shown in FIG. 1A.

FIG. 1A illustrates a top view (layout) of a double gate thin-film transistor (DGTFT) in an electronic device (e.g., photo sensor device), according to some embodiments of the present disclosure. FIG. 1B illustrates a cross-sectional view of the DGTFT taken along line A-A' shown in FIG. 1A.

Referring to FIGS. 1A and 1B, the DGTFT 100 includes a substrate 102, an insulating layer 104 disposed above the substrate 102, a gate electrode 106 disposed in the insulating layer 104 and above the substrate 102, a semiconductor layer 108 disposed in the insulating layer 104 and above the gate electrode 106, a transparent conductive layer 110 disposed corresponding to the semiconductor layer 108 and the substrate 102, a metal layer 112 disposed corresponding to the transparent conductive layer 110, an insulating layer 114 and an insulating layer 116 at least partially overlapped the transparent conductive layer 110 in the top view, and two source/drain 118 electrically connected to the semiconductor layer 108. The source/drain 118 can also be called the source/drain terminal (or terminal) of the DGTFT 100. In an embodiment, the transparent conductive layer 110 is at least partially overlapped the semiconductor layer 108 and the substrate 102 in the top view; the metal layer 112 is at least partially overlapped the transparent conductive layer 110.

The insulating layer 104 may comprises plural sub-layers (not shown). At least part of the plural sub-layers are disposed between the gate electrode 106 and the semiconductor layer 108. At least another part of the plural sub-layers are disposed between the gate electrode 106 and the substrate 102. At least another part of the plural sub-layers are disposed between the semiconductor layer 108 and the transparent conductive layer 110. In another embodiment, a first part of the plural sub-layers, the gate electrode 106, a second part of the plural sub-layers, the semiconductor layer 108, and a third part of the plural sub-layers may be sequentially disposed, but the disclosure is not limited thereto.

In one embodiment, the substrate 102 could be a rigid plate or a flexible plate and be transparent or opaque. For example, the rigid plate is a glass, and the flexible plate is a flexible substrate made of, for example but it is not limited thereto, polyimide PI or polyethylene terephthalate (PET). In another embodiment, the substrate 102 includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide.

As shown in FIGS. 1A and 1B, in this embodiment, the gate electrode 106 is used as the bottom gate of the DGTFT 100. The gate electrode 106 comprises some kinds of metal materials, such as copper, aluminum, gold, silver, another suitable metal material or combination thereof. In this embodiment, the source/drain 118 may also comprise metal material. The semiconductor layer 108 is used as a channel layer of the DGTFT 100. In this embodiment, the semiconductor layer 108 comprises polycrystalline silicon (also called poly-Si). In some embodiments, the semiconductor layer 108 may comprise amorphous silicon (also called a-Si), Indium Gallium Zinc Oxide (also called IGZO), another suitable semiconductor material or combination thereof.

In the present disclosure, the transparent conductive layer 110 and the metal layer 112 are collectively called the top gate of the DGTFT 100. The transparent conductive layer 110 may comprise indium tin oxide (ITO), zinc oxide (ZnO), indium gallium zinc oxide (IGZO), another transparent conductive material or combination thereof. The metal layer 112 comprises metal material (e.g., copper, aluminum, gold, silver, another suitable metal material or combination thereof).

In the present disclosure, the metal layer 112 is respectively disposed corresponding to the transparent conductive layer 110 and at least partially overlapping with the transparent conductive layer 110 or the semiconductor layer 108 in the top view of the DGTFT 100, as shown in FIGS. 1A and 1B. There is an opening (or aperture) region disposed between the metal layer 112_1 and the metal layer 112_2. It should be understood that the opening region 120 can be designed in any size (area) and shape. A part of the transparent conductive layer 110 is exposed in the opening region 120. The transparent conductive layer 110 is transparent or semi-transparent, but it is not limited thereto, so that the light can pass through the transparent conductive layer 110 to affect the semiconductor layer 108, thereby the DGTFT 100 can sense the light.

The insulating layers 104, 114, and 116 comprise insulating or dielectric material, such as silicon oxide ($SiO_x$), silicon nitride ($SiN_x$), or another suitable insulating or dielectric material. As shown in FIG. 1B, the insulating layers 104 separates the transparent conductive layer 110, the semiconductor layer 108, and the gate electrode 106 from each other, so that the transparent conductive layer 110 and the gate electrode 106 can be the gate of the DGTFT 100 (the top gate or bottom gate) to control the threshold voltage of the semiconductor layer 108 (the channel of the DGTFT 100).

In the present disclosure, as shown in FIG. 1B, the metal layer 112 is disposed corresponding to and electrically connected to the transparent conductive layer 110. The metal layer 112 and the transparent conductive layer 110 collectively called the gate electrode (e.g., the top gate of the DGTFT 100). It causes lower resistance than that of the gate electrode made only by transparent conductive material (e.g., ITO). It may cause a lower circuit operation delay time (time constant). For example, in a DGTFT, the gate line capacitor is about 11 pF, the gate line resistor made by ITO is about 826k ohm, and the gate line resistor made by metal is about 9.4k ohm. Therefore, the circuit operation delay time for ITO is 9.1 us and the circuit operation delay time for metal is 103.4 ns. The circuit operation delay time improved for metal is around 100 times less than the circuit operation delay time for ITO.

Figure 2A:
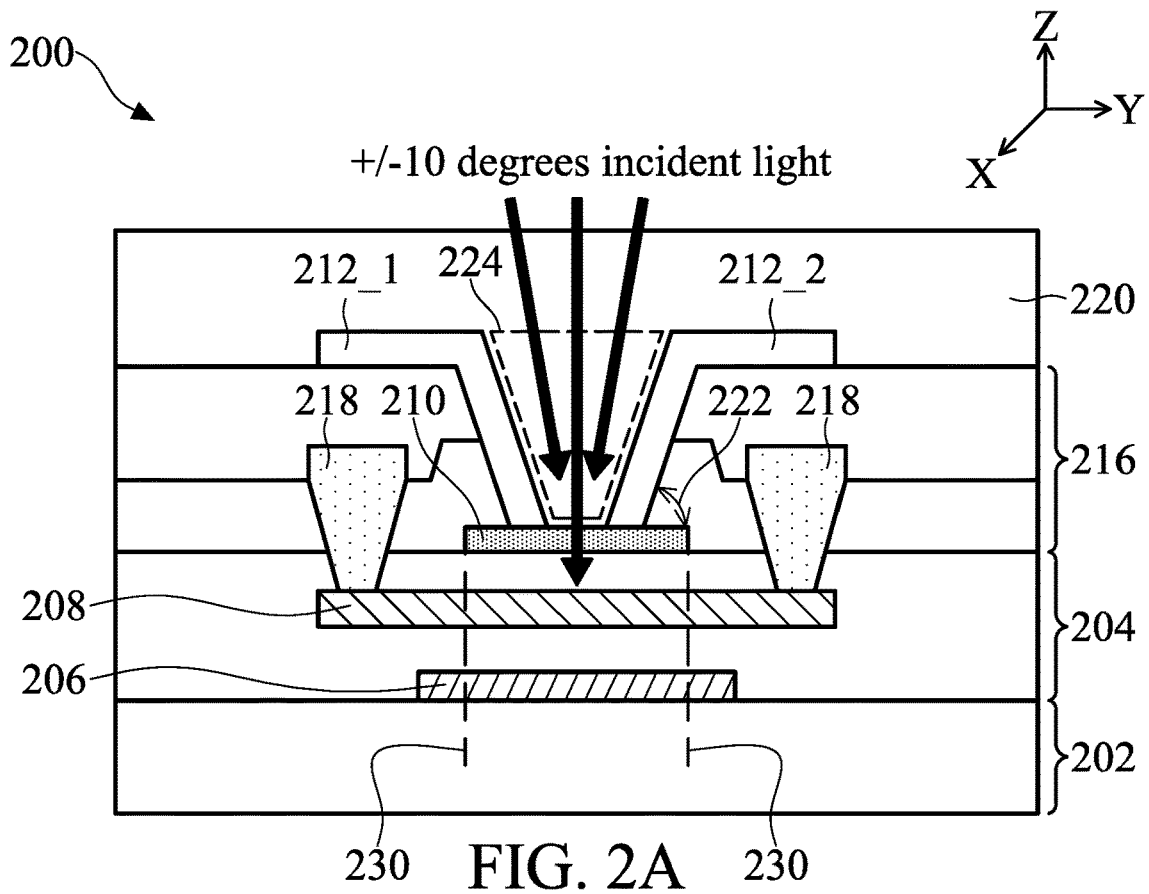
FIGS. 2A and 2B illustrate a cross-sectional view of an example of DGTFT in accordance with some embodiments of the present disclosure.
Figure 2B:
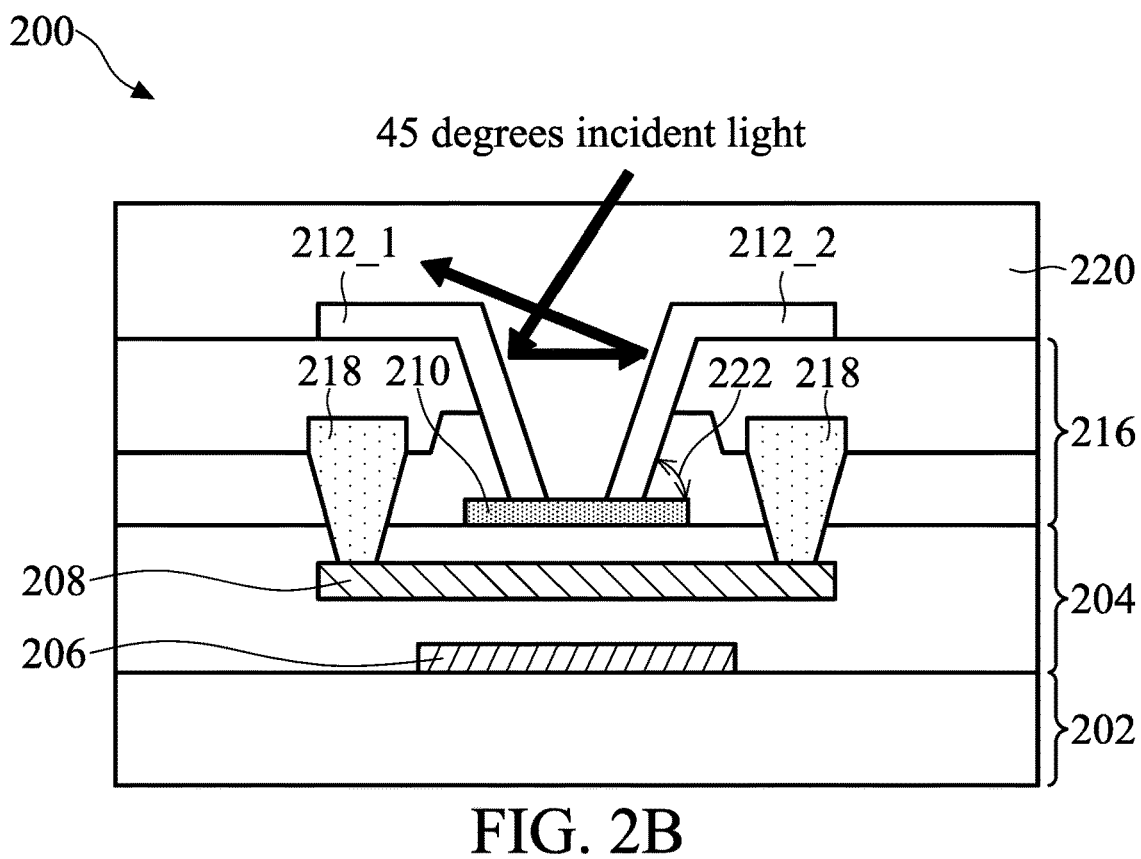

FIGS. 2A and 2B illustrate a cross-sectional view of an embodiment of DGTFT in accordance with some embodiments of the present disclosure. The DGTFT 200 shares many similarities with the DGTFT 100, but with some minor differences. The DGTFT 200 includes a substrate 202, an insulating layer 204 disposed above the substrate 202, a gate electrode 206 disposed in the insulating layer 204 and above the substrate 202, a semiconductor layer 208 disposed in the insulating layer 204 and above the gate electrode 206, a transparent conductive layer 210 disposed above the semiconductor layer 208 and the substrate 202, a metal layer 212 disposed corresponding to the transparent conductive layer 210, insulating layer 216 disposed between the metal layer 212 and the transparent conductive layer 210, and the source/drain 218 electrically connected to the semiconductor layer 208. The structure of the insulating layer 204 may be similar to the insulating layer 104. A passivation layer 220 covering a gate electrode 206, a semiconductor layer 208, a transparent conductive layer 210, and a metal layer 212 of the DGTFT 200. In this embodiment, the passivation layer 220 comprises insulating or dielectric material, as the material of the insulating layer discussed above.

As shown in FIG. 2A, the metal layer 212 covers the at least one of boundaries 230 of the transparent conductive layer 210 via the insulating layer 216 having an opening to form an opening region 224. In one embodiment, the boundary represents the most protruding point of the transparent conductive layer 210 in a direction Y. Similarly, the metal layer 212 is disposed corresponding to the transparent conductive layer 210. A part of the transparent conductive layer 210 is exposed in the opening region 224. Furthermore, the metal layer 212 extends in the opening and is electrically connected to the first transparent conductive layer 210. Specifically, the metal layer 212 extends along the sidewall of the insulating layer 216 to electrically connect to the transparent conductive layer 210.

As shown in FIG. 2A, the metal layer 212 extends in the opening, at an angle 222 with respect to the first transparent conductive layer 210. In one embodiment, the angle 222 is greater than or equal to 85 degrees, and is less than or equal to 90 degrees. In other embodiments, the angle 222 is greater than or equal to 45 degrees, and is less than or equal to 90 degrees, but it is not limited thereto. In another embodiment, the angle 222 also could be less than or equal to 45 degrees.

With the structure and the angle 222 of this embodiment, the incident light can be blocked except that around on-axis direction which is perpendicular to the top surface of the transparent conductive layer 210. Therefore, the DGTFT 200 may sense a clear object image (or object data). For example, a angle range of the incident light between +10 degrees and −10 degrees may be sensed and collected by the DGTFT 200, as shown in FIG. 2A. The incident light with 45 degrees or more may be blocked by the metal layer 212 of the DGTFT 200, as shown in FIG. 2B. The stray light from other direction (off-axis direction) may not be sensed and collected by the DGTFT 200.

Figure 2C:
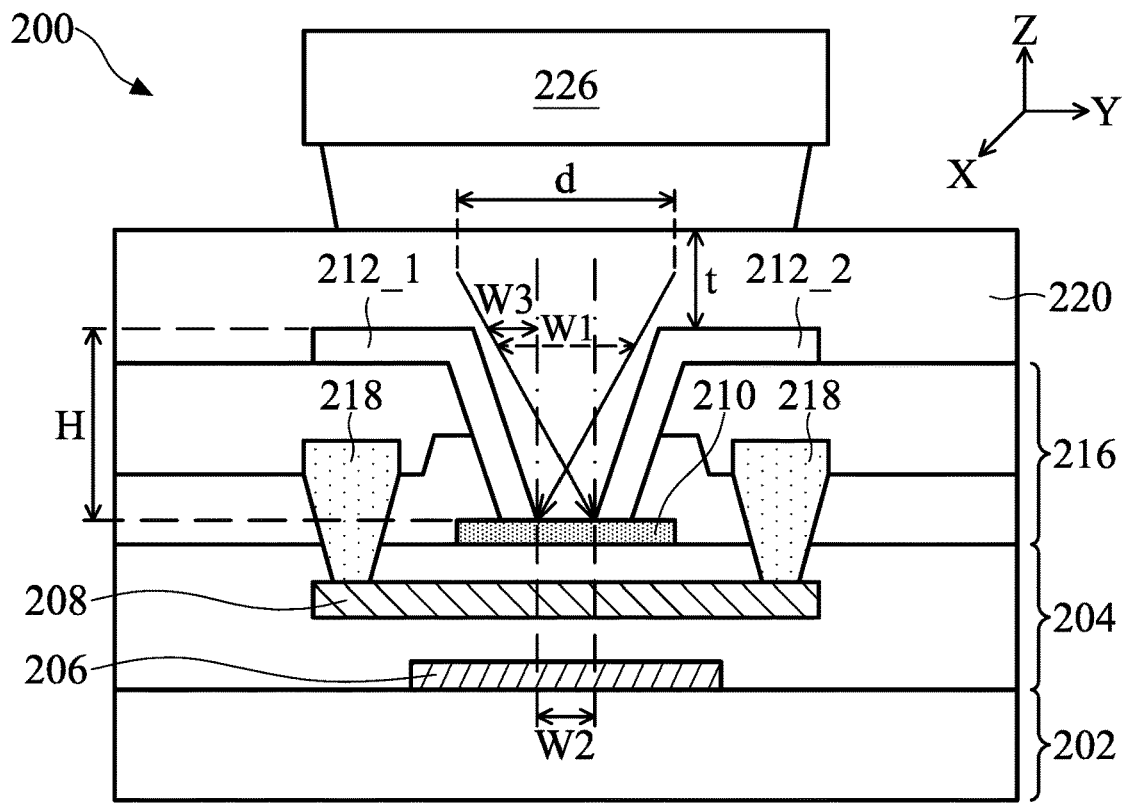
FIGS. 2C and 2D illustrate an embodiment of DGTFT sensing an object, in accordance with some embodiments of the present disclosure.
Figure 2D:
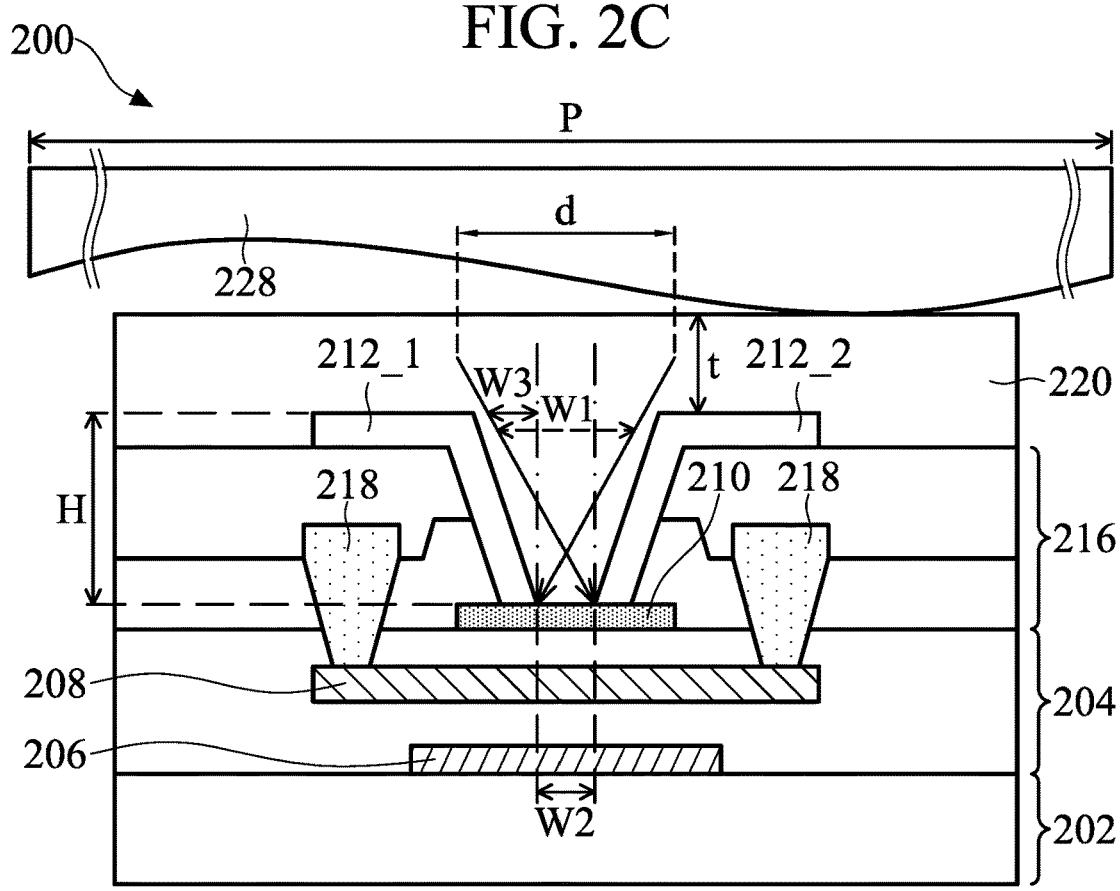

FIGS. 2C and 2D illustrate an embodiment of DGTFT sensing an object, in accordance with some embodiments of the present disclosure. In order to detect more accurate object data or images, the aspect ratio of the metal layer hole of $$\left(\frac{W2}{H} \text{ and } \frac{W3}{H}\right)$$

the DGTFT 200 should follow the formula below:

$$2t\left(\frac{W2}{H} + \frac{W3}{H}\right) + W1 \le d$$

In the above formula, d is the minimum width of the range that the DGTFT 200 can sense along a direction Y, t is the thickness of the passivation layer 220 along a direction Z, W1 is the maximum opening width between the metal layer 212_1 and the metal layer 212_2 along the direction Y, W2 is the minimum opening width between the metal layer 212_1 and the metal layer 212_2 along the direction Y, W3 is (W1-W2)/2, and H along the direction Z is the height from a top surface of the transparent conductive layer 210 to a top surface of the metal layer 212 along the direction Z, as shown in FIG. 2C. Using the above formula, the aspect ratio of the metal layer hole can be designed to sense the object 226.

For example, as shown in FIG. 2D, in cases where the DGTFT 200 senses the fingerprint pattern 228, the pitch p of the fingerprint pattern 228 is around 400 um in average. In order to sense a clear object image, it is better to focus on a quarter of the pitch p (100 um) to be recognized. Assume that d is 100 um, W1 is 10 um, W2 is 5 um, and t is 10 um: It can be calculated that the height H should be no less than 1.67 um. The size of the DGTFT 200 structure can be designed using the above formula. Furthermore, it should be understood that, according to the above formula, if the thickness t of the passivation layer 220 increases, more layer stacks are necessary for the metal layer 212 to increase height H.

Figure 3:
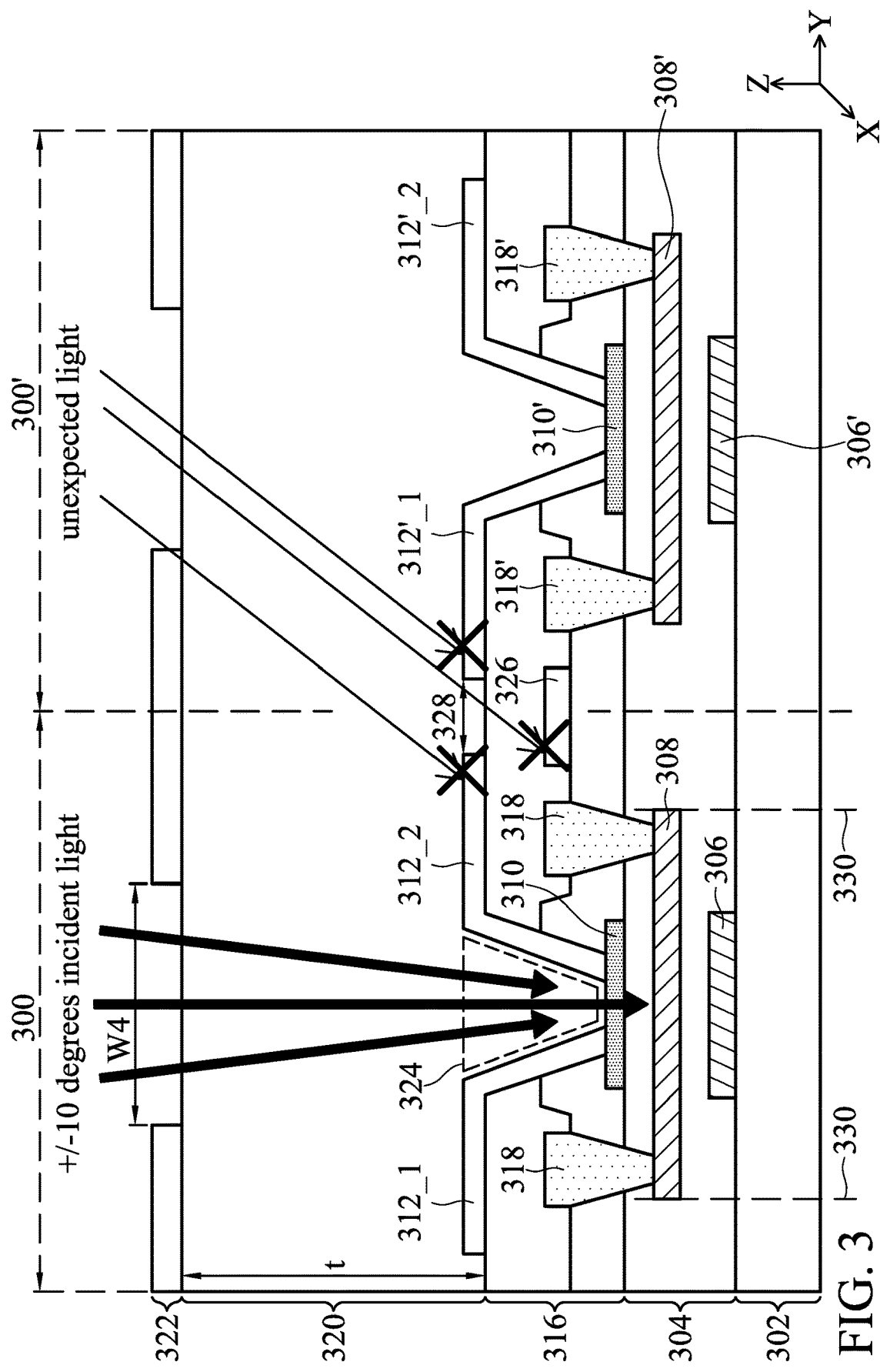
FIG. 3 illustrates a cross-sectional view of an embodiment of two adjacent DGTFTs in accordance with some embodiments of the present disclosure.

FIG. 3 illustrates a cross-sectional view of an embodiment of two adjacent DGTFTs in accordance with some embodiments of the present disclosure. The DGTFT 300 is similar to the DGTFT 200. The DGTFT 300 includes a substrate 302, an insulating layer 304, a gate electrode 306, a semiconductor layer 308, a transparent conductive layer 310, an insulating layer 316 with an opening, the first metal layer 312, two source/drain 318. The first metal layer 312 extends in the opening to form an opening region 324. A passivation layer 320 is disposed above the DGTFT 300, an opaque material layer 322 is disposed above the passivation layer 320 and does not cover the opening region 324 in the top view of the DGTFT 300. Specifically, the opaque material layer 322 also has an opening region at least partially overlap the opening region 324. It should be noted that the metal layer 312 is enlarged to extend beyond at least one of the boundaries 330 of the semiconductor layer 308 along a direction Y. In one embodiment, the structure of the insulating layer 304 may be similar to the insulating layer 104.

The opaque material layer 322 is also called a black matrix (BM). The opaque material layer 322 can comprise opaque material, such as chromium (Cr), polyimide, or another suitable opaque material. The opaque material layer 322 is separated from the metal layer 312 by the passivation layer 320 to control (or restrict) incident light angle. Specifically, the opaque material layer 322 is disposed not to cover the opening region 324 and the passivation layer 320 is disposed between the opaque material layer 322 and the metal layer 312 along a direction Z, so that the angle of the incident light can be controlled.

Similarly, with the opening region of the opaque material layer 322 and the opening regions 324, the incident light can be blocked except that incomes around on-axis direction which is perpendicular to the top surface of the transparent conductive layer 310. The DGTFT 300 may sense a clear object image (or object data). For example, an angle range of the incident light between +10 degrees and −10 degrees may be sensed and collected by the DGTFT 300, as shown in FIG. 3A.

As described above, in order to detect more accurate object data or images, the aspect ratio of the metal layer hole of the DGTFT should follow the formula. In this embodiment, the parameter of passivation layer thickness (e.g., thickness t of the passivation layer 320 in FIG. 3A) in the formula may be assumed to be 0. Therefore, the DGTFT 300 should follow the formula below:

$$W4 \leq d$$

Here, d is the minimum width of the range that the DGTFT 300 can sense, and W4 is the maximum opening width of the opaque material layer 322 along a direction Y. It should be understood that the opening region of the opaque material layer 322 can control the sensing width of the DGTFT 300 using the above formula.

In this embodiment, the metal layer 312 is enlarged, as described above. This enlarged metal layer 312 may block incident light coming from the neighboring opening region of the opaque material layer 322. As shown in FIG. 3, the structure of the DGTFT 300' is the same as the structure of DGTFT 300, which is not described in detail herein. The incident light comes from opening region of the opaque material layer 322 of DGTFT 300' can be blocked by the metal layer 312 and may not affect the DGTFT 300. The smaller the gap 328 between the metal layer of DGTFT 300 and 300', the more effective the blocking is. Therefore, the DGTFT 300 may sense a clear object image (or object data) not affected by unexpected light.

In some embodiments, a metal layer 326 is disposed corresponding to the transparent conductive layer 310 and in the insulating layer 316 and between the two adjacent DGTFTs 300 and 300', as shown in FIG. 3. In one embodiment, the DFTFT 300' is adjacent to the DFTFT 300, which represents the DGTFT 300' is most close to DGTFT 300 in a direction Y. The metal layer 326 is under the gap 328 and between the metal layer 312_1 and the metal layer 312_2 of DGTFTs 300 and 300', so that the incident light passing through the gap 328 can be blocked. Therefore, the DGTFT 300 may sense a clear object image (or object data) not affected by unexpected light. In some embodiments, the metal layer 326 and the source/drain 318 have the same fabrication. In other words the metal layer 326 and the source/drain 318 can be formed at the same time.

Figure 4A:
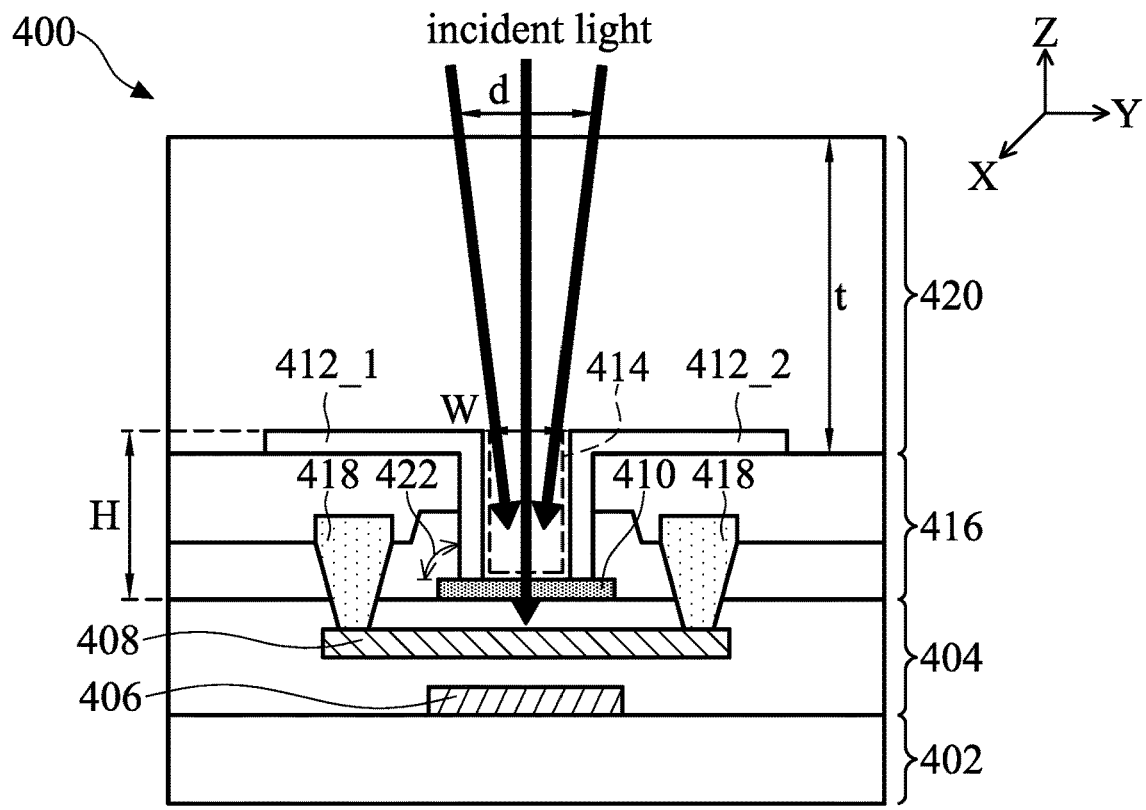
FIG. 4A illustrates a cross-sectional view of an embodiment of DGTFT in accordance with some embodiments of the present disclosure.

FIG. 4A illustrates a cross-sectional view of an embodiment of DGTFT in accordance with some embodiments of the present disclosure. The DGTFT 400 is similar to the DGTFT 200. The DGTFT 400 includes a substrate 402, an insulating layer 404, a gate electrode 406, a semiconductor layer 408, a transparent conductive layer 410, a metal layer 412, an insulating layer 416, two source/drain 418, and a passivation layer 420. In one embodiment, the structure of the insulating layer 404 may be similar to the insulating layer 104.

Figure 4B:
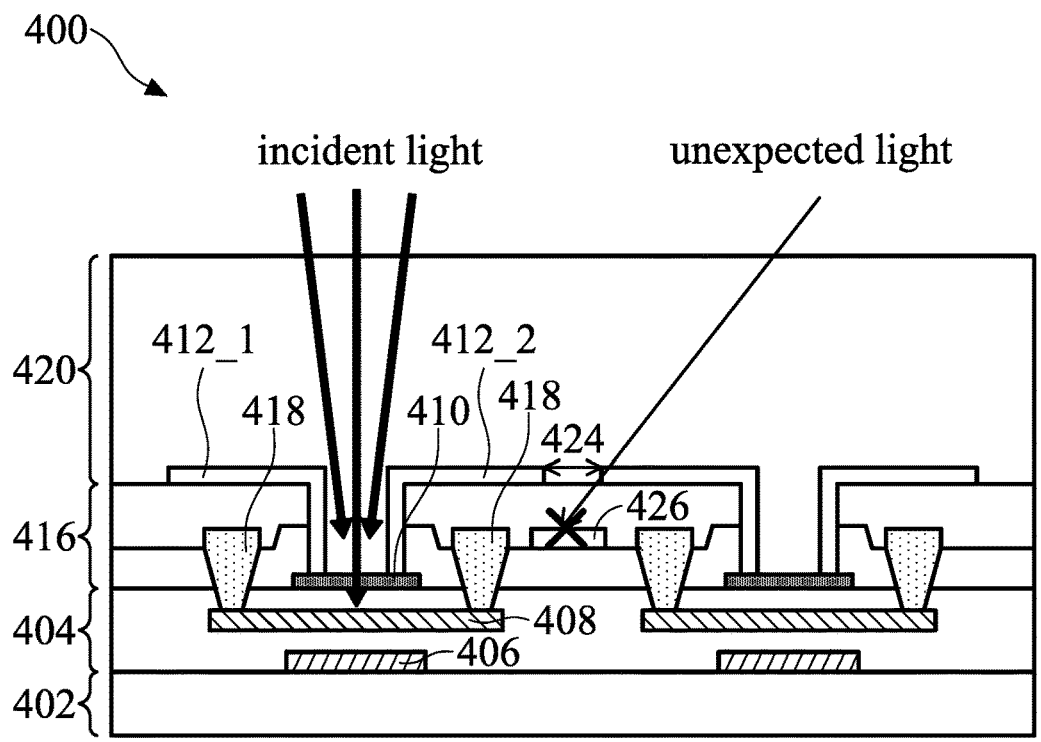
FIG. 4B illustrates a cross-sectional view of an embodiment of two adjacent DGTFTs with a metal layer between them, in accordance with some embodiments of the present disclosure.

In this embodiment, like the DGTFT 200 in FIGS. 2A to 2D, the first metal layer 412 extends in the opening of the insulating layer 416, at an angle 422 with respect to the first transparent conductive layer 410, as shown in FIG. 4A. However, the angle 422 is substantially equal to 90°. In other words, there is a precipitous taper angle between the metal layer 412 and the transparent conductive layer 410. In such cases, the metal layer 412 can restrict unexpected light (e.g., stray light or off-axis light) of the incident light entering the opening region 414, as shown in FIG. 4A. Specifically, with the structure and the angle 422 (i.e., substantially 90°) of this embodiment, the incident light can be blocked except that incomes around on-axis direction which is perpendicular to the top surface of the transparent conductive layer 410. Therefore, the DGTFT 400 may sense a clear object image (or object data). It should be noted that the metal layer 412 in this embodiment controls the sensing width of the DGTFT 400, so that an opaque material layer with an opening region may be unnecessary. In some embodiments, a metal layer 426 may also be disposed in the insulating layer 416 and between the DGTFT 400 and the neighboring DGTFT, as shown in FIG. 4B. The incident light (unexpected light) passing through the gap 424 between the DGTFT 400 and the neighboring DGTFT can be blocked.

Figure 4C:
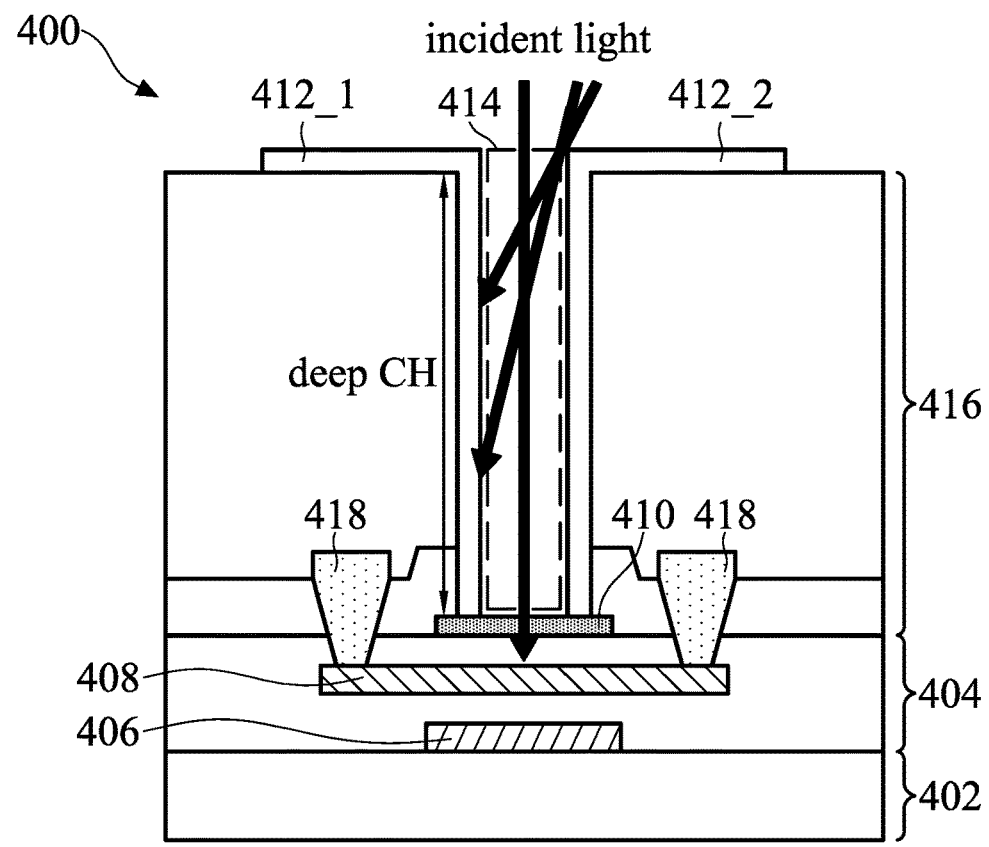
FIGS. 4C and 4D illustrate a cross-sectional view of an embodiment of DGTFT in accordance with some embodiments of the present disclosure.

In some embodiments, the thickness of the insulating layer 416 is large, so that the opening region 414 is deep. The deep opening region 414 forms a deep contact hole (deep CH), as shown in FIG. 4C. Thanks to this deep contact hole, the DGTFT 400 may be able to sense a clear object image (or object data).

Figure 4D:
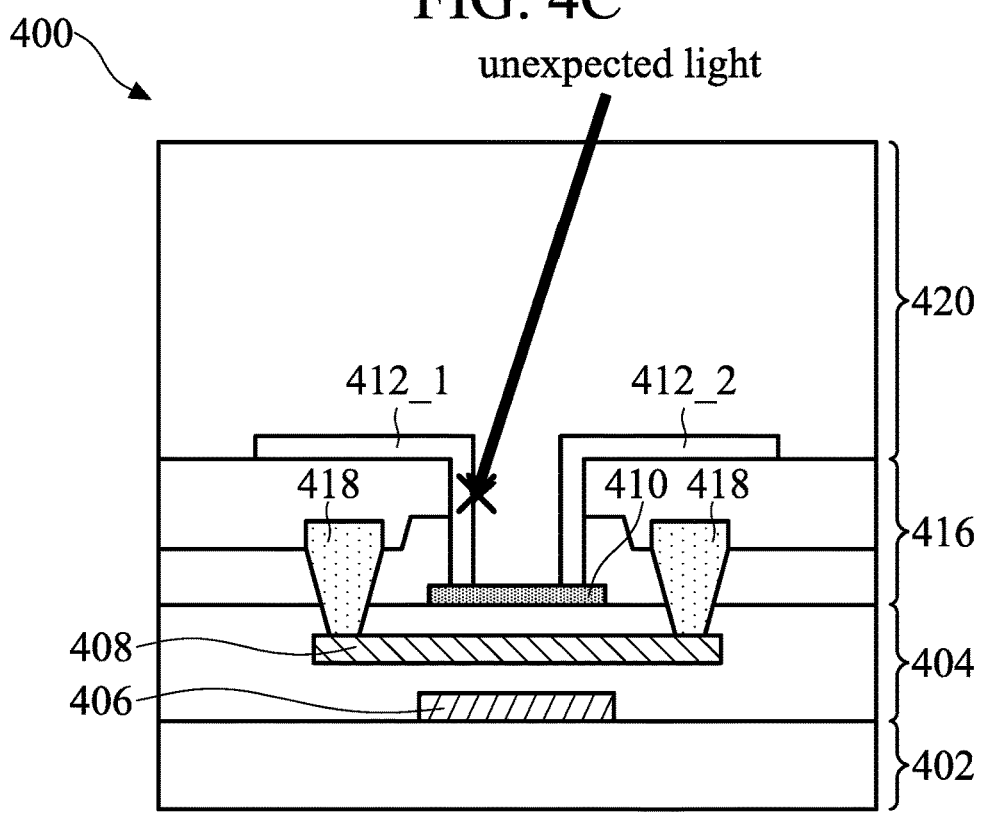

In other embodiments, the metal layer 412 comprises a low reflectivity material having a reflectivity lower than 60% to visible light. The low reflectivity material includes chromium (Cr), gold (Au), nickel (Ni), or another suitable material with low reflectivity. The unexpected light (e.g., stray light or off-axis light) that irradiates the metal layer 412 may not seriously affect the sensing of the DGTFT 400, as shown in FIG. 4D. The DGTFT 400 may sense a clear object image (or object data).

Similarly, in order to detect more accurate object data or images, the aspect ratio of the metal layer hole $$\left(\frac{W}{H}\right)$$

of the DGTFT the formula below:

$$2t\left(\frac{W}{H}\right) + W \le d$$

In the above formula, d is the minimum width of the range that the DGTFT 400 can sense, t is the thickness of the passivation layer 420 along a direction Z, W is the maximum opening width between the metal layer 412_1 and the metal layer 412_2 along a direction Y, and H is the height from a top surface of the transparent conductive layer 410 to a top surface of the metal layer 412 along the direction Z, as shown in FIG. 4A. The aspect ratio of the metal layer hole can be designed using the above formula.

As shown in FIGS. 1A-4D, the transparent conductive layer and the metal layer collectively form the top gate of the DGTFT. However, in some embodiments, the transparent conductive layer and the metal layer may be collectively formed as the bottom gate of the DGTFT. Specifically, the gate electrode (i.e., original bottom gate shown in FIGS. 1A-4D) can be disposed as the top gate of the DGTFT and the transparent conductive layer and the metal layer (i.e., original top gate shown in FIGS. 1A-4D) can be collectively disposed as the bottom gate of the DGTFT.

Figure 5:
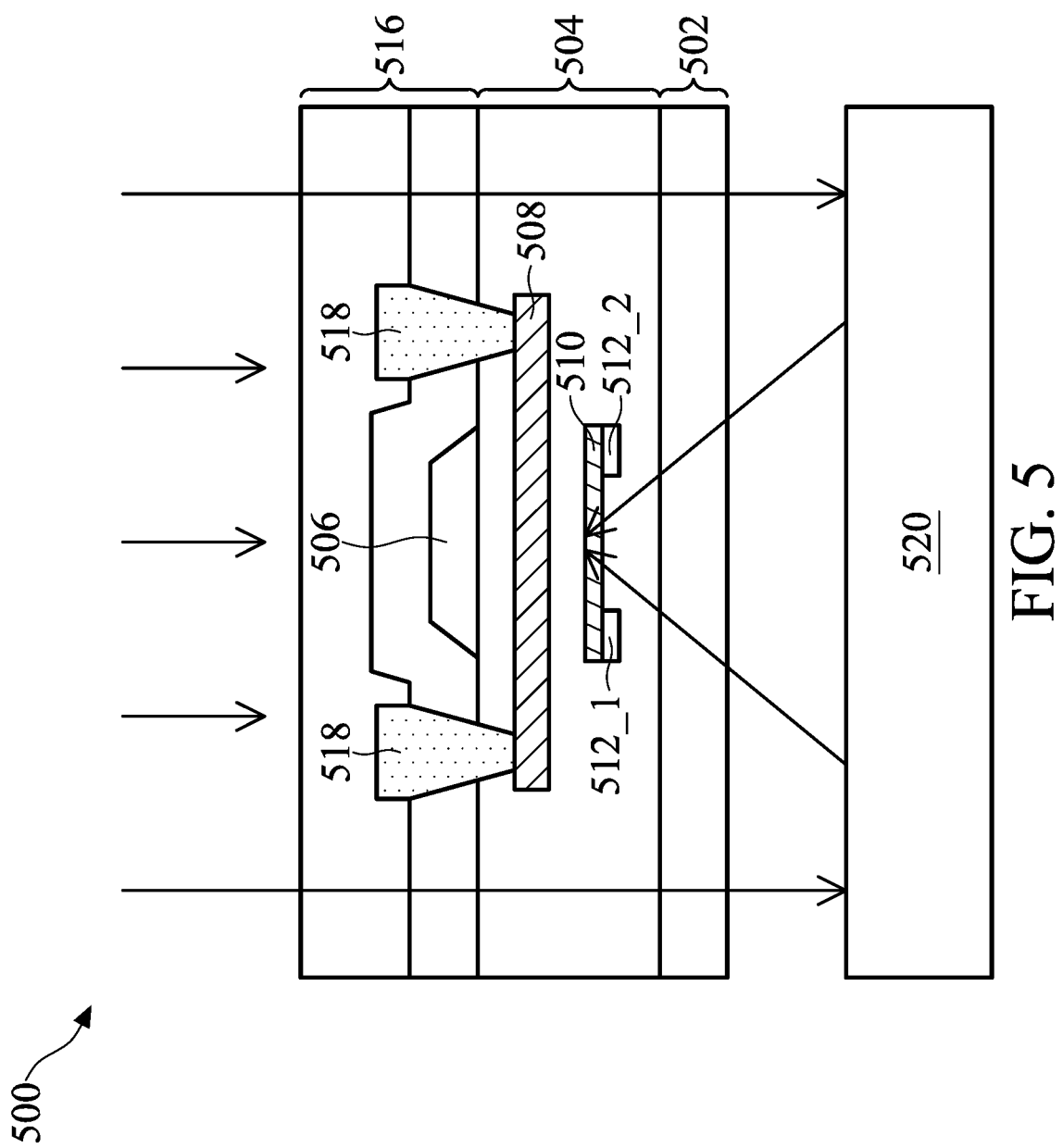
FIG. 5 illustrates a cross-sectional view of an embodiment of DGTFT with reversed structure, in accordance with some embodiments of the present disclosure.

FIG. 5 illustrates a cross-sectional view of an embodiment of DGTFT with reversed structure relative to the embodiments in FIGS. 1A to 4D, in accordance with some embodiments of the present disclosure. The DGTFT 500 includes a substrate 502, an insulating layer 504 disposed on an upper surface of the substrate 502, a transparent conductive layer 510 disposed in the insulating layer 504 and above the substrate 502, a metal layer 512 disposed corresponding to the transparent conductive layer 510, a semiconductor layer 508 disposed in the insulating layer 504 and above the transparent conductive layer 510, a gate electrode 506 disposed above the semiconductor layer 508, an insulating layer 516 disposed above the gate electrode 506, and two source/drain 518 electrically connected to the semiconductor layer 508. In one embodiment, the structure of the insulating layer 504 may be similar to the insulating layer 104.

As discussed above, in this embodiment, the transparent conductive layer 510 and the metal layer 512 are collectively used as a bottom gate of the DGTFT 500 and the gate electrode 506 is used as the top gate of the DGTFT 500. Similarly, the metal layer 512 at least partially overlaps the transparent conductive layer 510 or the semiconductor layer 508 in top view of the substrate 502.

In this embodiment, the DGTFT 500 senses an object 520 by the reflected light from the object 520. Specifically, the back light may irradiate the object 520 and then be reflected back as reflected light to the DGTFT 500. The metal layer 512 may also protect the DGTFT 500 from stray light from another direction, as per the embodiments discussed above. Furthermore, in such cases, the substrate 502 should be thinner and comprised transparent and insulating material for light to pass through, thereby avoiding image blur. For example, the substrate 502 may comprises silicon oxide ($SiO_x$), silicon nitride ($SiN_x$), glass or another suitable material.

In one embodiment, a photo sensor device comprises two DGTFTs in one pixel. One of the DGTFTs is a DGTFT having an opening region in the above embodiments, and the other is a DGTFT (reference transistor) without an opening region in the above embodiments.

Figure 6:
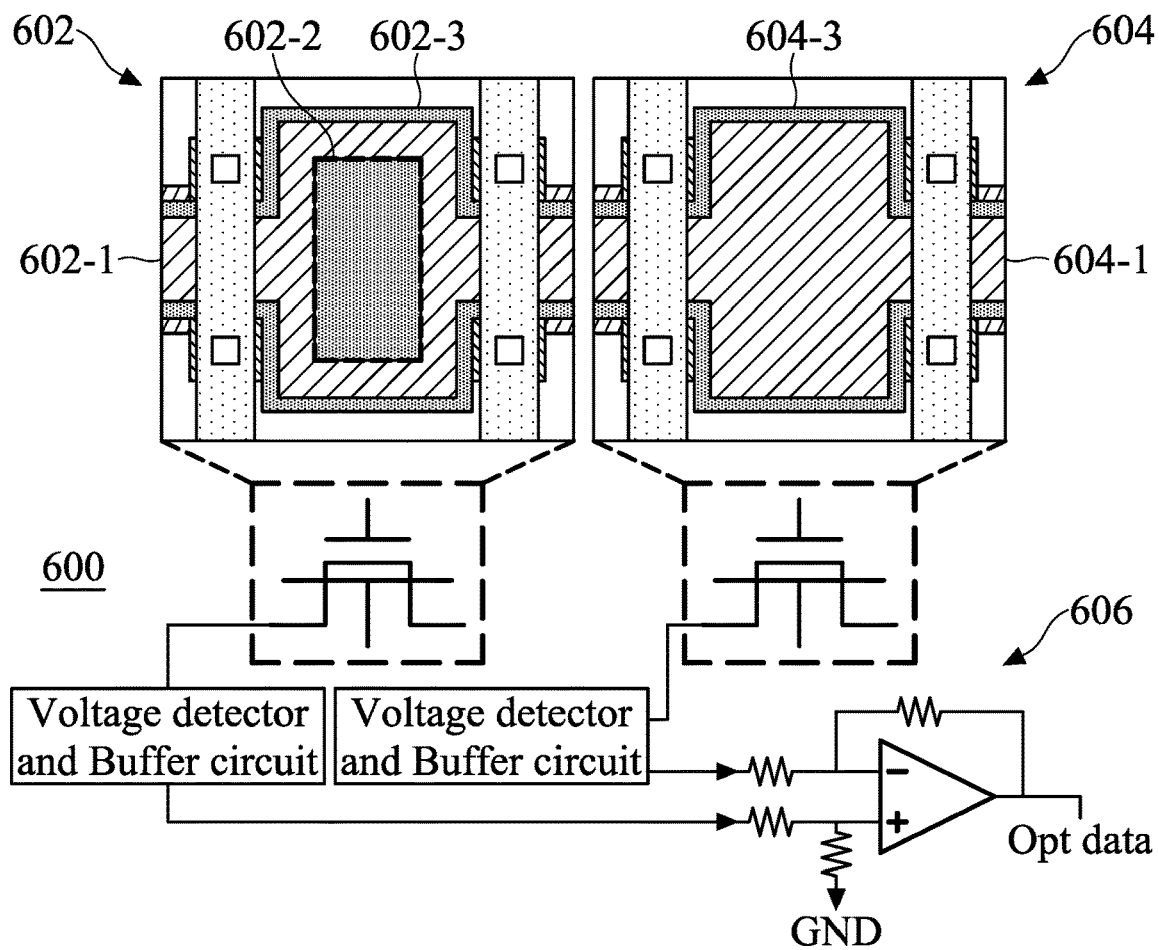
FIG. 6 illustrates an embodiment of a photo sensor device, in accordance with some embodiments of the present disclosure.

FIG. 6 illustrates an embodiment of a photo sensor device, in accordance with some embodiments of the present disclosure. The photo sensor device 600 includes a DGTFT 602, a DGTFT 604, and a differential subtractor circuit 606. The DGTFT 602 includes a metal layer 602-1, an opening region 602-2 and a transparent conductive layer 602-3, as per the embodiments discussed above. The DGTFT 604 is adjacent to the DGTFT 602 and includes a metal layer 604-1 and a transparent conductive layer 604-3. However, the DGTFT 602 is different than the DGTFT 604, as there is not an opening region. In other words, the metal layer 604-1 covers the transparent conductive layer 604-3 (the metal layer 604-1 is above the transparent conductive layer 604-3). As shown in FIG. 6, a source/drain terminal of the DGTFT 602 and a source/drain terminal of the DGTFT 604 are respectively electrically connected to two input terminals of the differential subtractor circuit 606 through or not through the voltage detector and buffer circuit. When the photo sensor device 600 is irradiated by the light, the DGTFTs 602 and 604 each generates an output data via the source/drain terminals to the voltage detector and buffer circuit. The voltage detector and buffer circuit receives the output data and converts it into another output data representing the voltage difference (also called as drop amount of the voltage, which will be discussed in below) between the output data and a reference voltage (VREF). The voltage detector and buffer circuit also has another buffer circuit for reducing the influence of the small input impedance on later circuit or long output wiring.

The differential subtractor circuit 606 compares two output data from the source/drain terminals of DGTFTs 602 and 604 (or from the voltage detector and buffer circuit), and then outputs the difference value of DGTFTs 602 and 604. The DGTFTs 602 and 604 are fabricated using substantially the same process. Since the DGTFT 604 has no opening region, the light cannot be sensed by the DGTFT 604. Therefore, in this embodiment, the photo sensor device 600 can remove a variation in the characteristics of DGTFT caused by process fabrication and exogenous noise by comparing two output data from their two DGTFT when the photo sensor device 600 senses the light. Furthermore, it should be noted that the differential subtractor circuit 606 can be any suitable differential subtractor circuit. The differential subtractor circuit 606 shown in FIG. 6 is exemplary, and is not intended to limit the disclosure. In some embodiments, one of the reference transistors (DGTFT with no opening region, such as DGTFT 604) is placed per the number of normal transistors (DGTFT with an opening region, such as DGTFT 602) to increase the available area. It should be understood that the area or shape of the opening region is exemplary, and is not intended to limit the disclosure.

Figure 7:
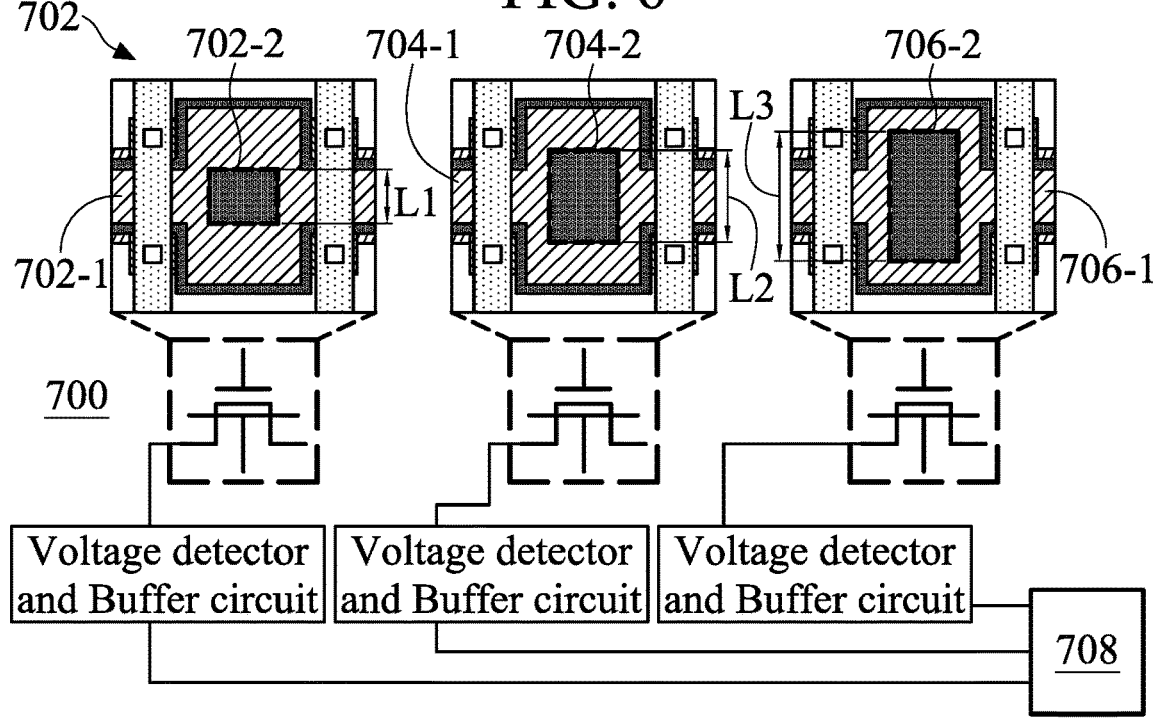
FIG. 7 illustrates an embodiment of a photo sensor device, in accordance with some embodiments of the present disclosure.

In one embodiment, a photo sensor device 700 comprises multiple DGTFTs in one pixel. Those DGTFTs have opening regions, as discussed above, however, the area of the opening region of those DGTFTs are different. FIG. 7 illustrates an embodiment of a photo sensor device, in accordance with some embodiments of the present disclosure. The photo sensor device 700 includes a DGTFT 702, a DGTFT 704, a DGTFT 706, and a comparator circuit 708. The DGTFTs 702, 704, and 706 have opening regions 702-2, 704-2, and 706-2, respectively, as the embodiments of DGTFT discussed above. Furthermore, the DGTFT 702, the DGTFT 704, and the DGTFT 706 are adjacent to each other.

As shown in FIG. 7, the area of opening regions 702-2, 704-2, and 706-2 are different. The length L3 of opening region 706-2 is longer than the length L1 and L2 of the opening regions 702-1 and 704-1. The length L2 of opening region 704-2 is longer than the length L1 of opening region 702-2. Specifically, in this embodiment, the area of opening region 706-2 is the largest and the area of opening region 702-2 is the smallest. The opening regions of DGTFTs 702, 704, and 706 have different areas, DGTFTs 702, 704, and 706 may be affected differently by the light, and therefore output different data. It should be understood that the area or shape of the opening region is exemplary, and is not intended to limit the disclosure.

A source/drain terminal of the DGTFT 702, a source/drain terminal of the DGTFT 704, and a source/drain terminal of the DGTFT 706 are respectively electrically connected to the input terminal of the comparator circuit 708 through or not through the voltage detector and buffer circuit. In this embodiment, the photo sensor device 700 is irradiated by the light. Then, the comparator circuit 708 respectively compares each output data from DGTFTs 702, 704, and 706 with predetermined amount of light and outputs binary data. It is possible to receive the intensity of the photo sensor as digital data by picking up which DGTFT outputs "1" (source/drain outputs "high voltage level"). Therefore, the output combinations of DGTFTs 702, 704, and 706 can be coded as 2-bit data corresponding to the light sensed by the photo sensor device 700. It should be noted that the comparator circuit 708 can be any suitable comparator circuit.

For example, the following table shows output data of the DGTFTs 702, 704, 706, and the corresponding 2-bit data when the photo sensor device 700 senses four different intensities of light (corresponding to different gray scale levels).

| data coding for light (for example of 4 level gray-scale) | | | | |
|---|---|---|---|---|
| gray scale level of light | Output of DGTFT 702 | Output of DGTFT 704 | Output of DGTFT 706 | 2-bit data |
| 0 | 0 | 0 | 0 | 00 |
| 1 | 0 | 0 | 1 | 01 |
| 2 | 0 | 1 | 1 | 10 |
| 3 | 1 | 1 | 1 | 11 |

As shown in the table, there are four different output combinations of DGTFTs 702, 704, and 706 corresponding to four gray scale level of light. These output combinations can be coded as 2-bit data "00", "01", "10", and "11". Therefore, the gray scale level of light, or the intensity of light, can be transferred as digital data. In another embodiment, because the opening regions of DGTFTs 702, 704, and 706 have different areas, therefore, when an intensity of light is enlarged, and the four gray scale level of light or the transferred digital data is increased. In some embodiments, as illustrated in FIG. 7, each output data from DGTFT with an opening region is coded by each A/D convertor to receive finer bits of data than using only one DGTFT with an opening region. The photo sensor device 700 comprises three DGTFTs 702, 704, and 706, however, it should be understood that, in some embodiments, the photo sensor device can comprise multiple DGTFTs, such as four DGTFTs or more.

The DGTFTs discussed above are used as the photo sensor device. In some embodiments, the DGTFTs discussed above can be combined with display devices, such as an organic light emitting diode display device, a quantum light emitting diode display device, a mini light emitting diode display device, a micro light emitting diode display device, or a liquid crystal display device, but it is not limited thereto.

A plurality of DGTFTs are used as photo sensor area in the display device to sense light or an object (e.g., a fingerprint pattern). For example, the photo sensor area can be used to sense fingerprint patterns. The structure and fabrication process of the DGTFTs are the same as or similar to the fabrication process of the TFTs in the display devices. Therefore, the DGTFTs used for photo sensor area and the TFTs used for pixel of the display can be formed at the same time.

Figure 8B:
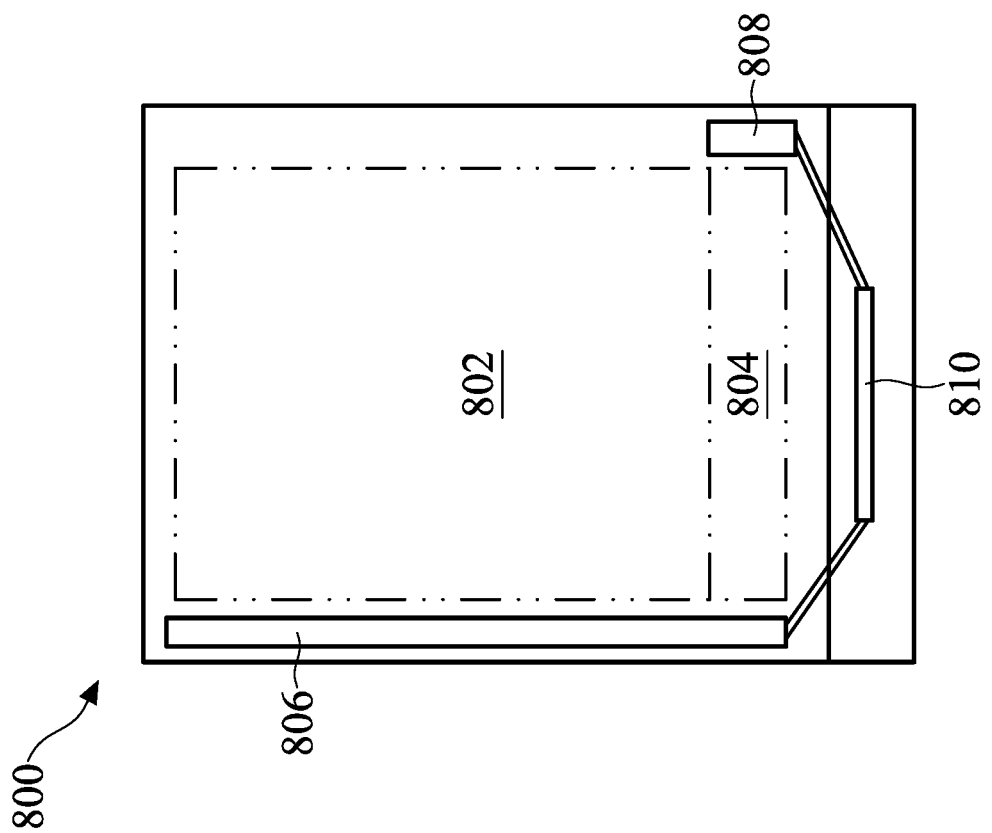
FIGS. 8A and 8B illustrate a display device combined with photo sensor devices in accordance with some embodiments of the present disclosure.
Figure 8A:
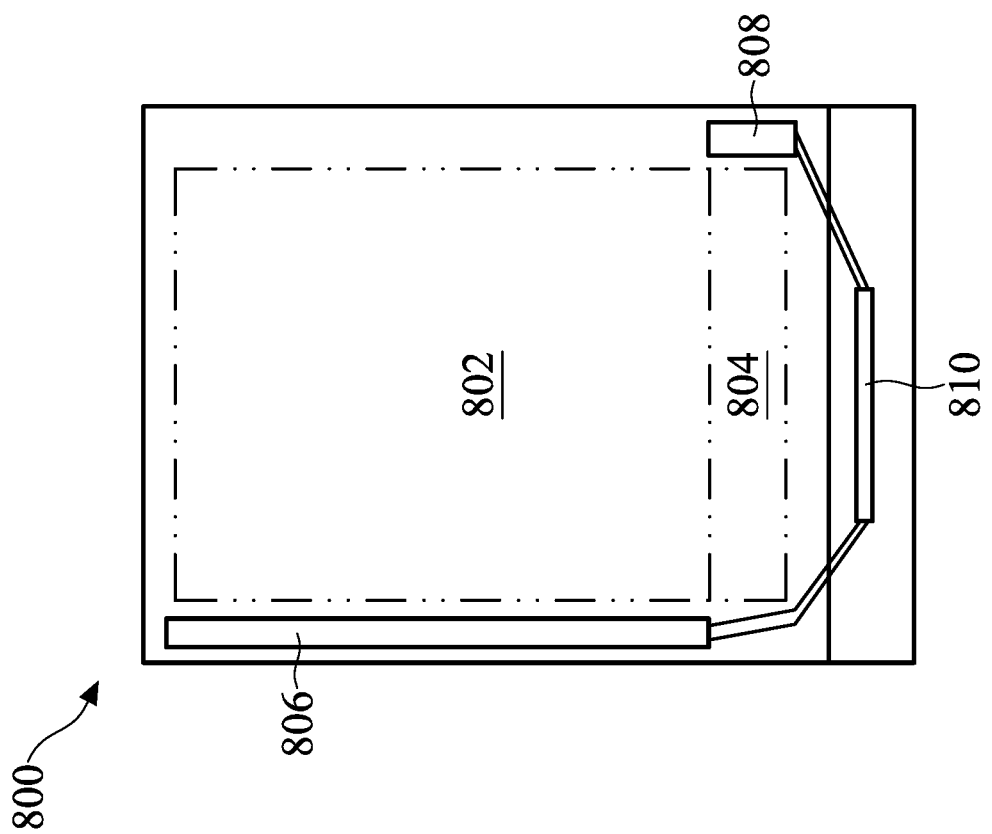

FIGS. 8A and 8B illustrate a display device combined with photo sensor devices, in accordance with some embodiments of the present disclosure. The electronic device 800 includes an area 802, an area 804, a gate driving circuit 806, a gate driving circuit 808, and an IC 810. The area 802 is used for display image and the area 804 is used for sensing light or object (e.g., a fingerprint pattern) or display image and sensing light or object at the same time, but it is not limited thereto. A plurality of DGTFTs are disposed in the area 804. The area 802 is separated from the area 804. In some embodiments, the gate driving circuit 806 is use to control the area 802 and the gate driving circuit 808 is use to control the area 804, as shown in FIG. 8A. In other embodiments, the gate driving circuit 806 is used to not only control area 802, but also to control one part of the area 804, and the gate driving circuit 808 is used for to control the other part of the area 804 as shown in FIG. 8B.

As shown in FIGS. 8A and 8B, area 802 is separated from the area 804. Specifically, the DGTFTs used for sensing are not integrated into the display area. In some embodiments, the DGTFTs are integrated into the display area. Therefore, the display area can be used for display image or sensing light or object. The DGTFTs used as photo sensors integrated into the TFTs of the display device are discussed below.

Figure 9:
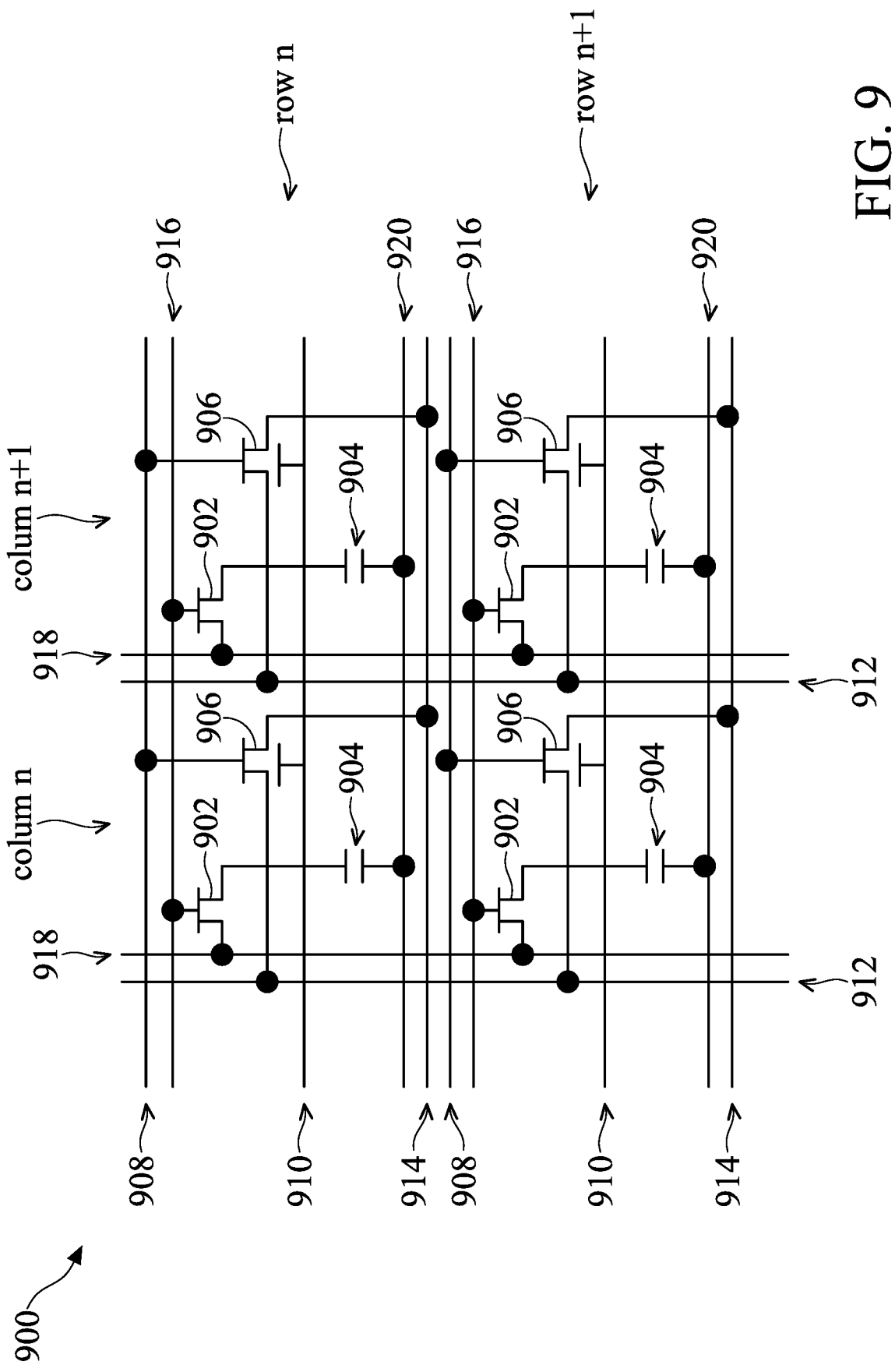
FIG. 9 illustrates a DGTFT array integrated into the TFT array of the display area in the LCD, in accordance with some embodiments of the present disclosure.

FIG. 9 illustrates a DGTFT array integrated into the TFT array of the display area in the LCD, in accordance with some embodiments of the present disclosure. For convenience, FIG. 9 merely shows a portion of the full array. The array 900 includes four TFTs 902, four capacitors 904, and four DGTFTs 906, arranged in column n, n+1 and row n, n+1 of the full array. Each of the DGTFTs 906 is adjacent to one of the TFTs 902 (or one TFT 902 is adjacent to one of the DGTFTs 906). The top gate (e.g., the metal layer 212) of the DGTFT 906 is electrically connected to line 908 (also called a top gate line), the bottom gate of the DGTFT 906 is electrically connected to line 910 (also called a bottom gate line), one source/drain terminal of the DGTFT 906 is electrically connected to line 912 (also called a readout line), and another source/drain terminal of the DGTFT 906 is electrically connected to line 914 (also called a ground line). The DGTFTs 906 in the same row are electrically connected to the same line 908, line 910, line 914, and the DGTFTs 906 in the same column are electrically connected to the same line 912, as shown in FIG. 9. The gate of the TFT 902 is electrically connected to line 916 (also called a gate line), one source/drain terminal of the TFT 902 is electrically connected to line 918 (also called a data line), and another source/drain terminal of the TFT 902 is electrically connected to line 920 (also called a common line) through one of the capacitors 904. The TFTs 902 in the same row are electrically connected to the same line 916, line 920, and the TFTs 902 in the same column are electrically connected to the same line 918, as shown in FIG. 9. Using the arrangement in this embodiment, the array 900 can be used as a display device and can sense light and objects (e.g., a fingerprint pattern).

Figure 10A:
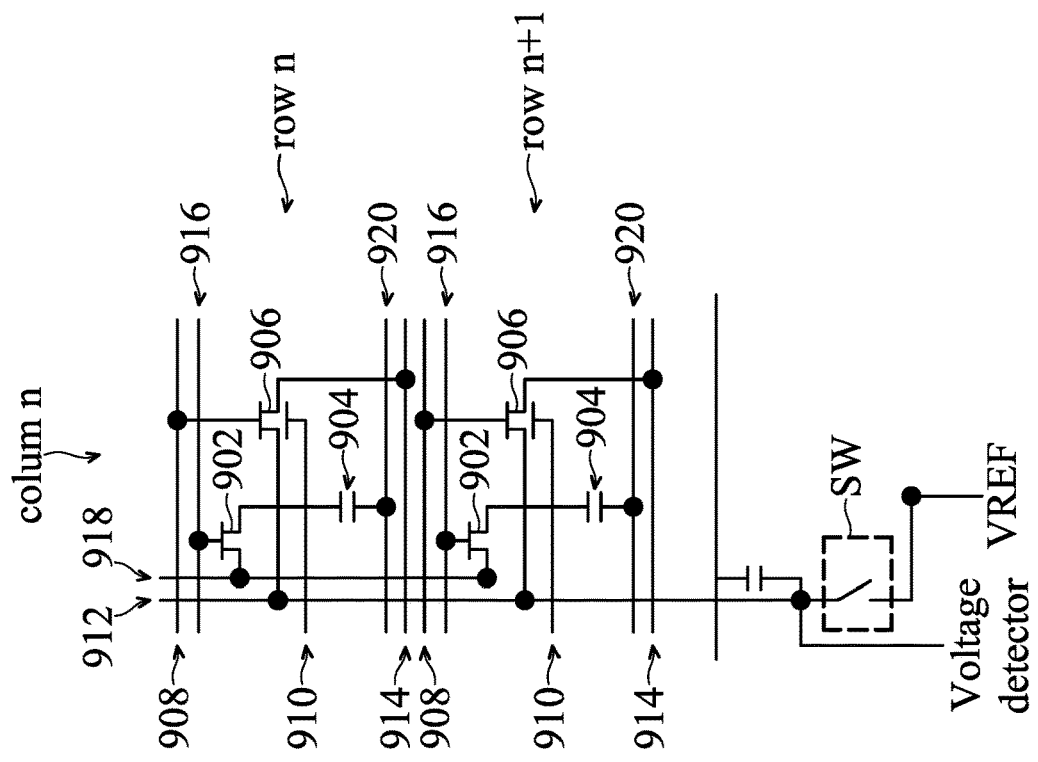
FIG. 10A illustrates a portion of the array in FIG. 9, in accordance with some embodiments of the present disclosure.

FIG. 10A illustrates a portion of the array in FIG. 9, in accordance with some embodiments of the present disclosure. For convenience, two TFTs 902, two capacitors 904, and two DGTFTs 906 arranged in column n and rows n, n+1. As shown in FIG. 10A, one source/drain terminal of the DGTFT 906 is electrically connected to a reference voltage VREF by the line 912 and the switch SW. The TFT 902 for LCD can be turned off by applying a gate OFF voltage (e.g., −10V) to the line 916. The line 912 is electrically connected to the line 914 when an ON voltage (e.g., +5V) is applied to the top gate of the DGTFT 906. The line 912 becomes floating when an OFF voltage (e.g., −10V) is applied to the top gate of the DGTFT 906. The line 912 is also electrically connected to the voltage detector (or the voltage detector and a buffer circuit) via the voltage measurement line. In this embodiment, an ON voltage (e.g., +15V) is applied to the bottom gate of the DGTFT 906 when the DGTFT 906 senses the object (e.g., a fingerprint pattern).

Figure 10B:
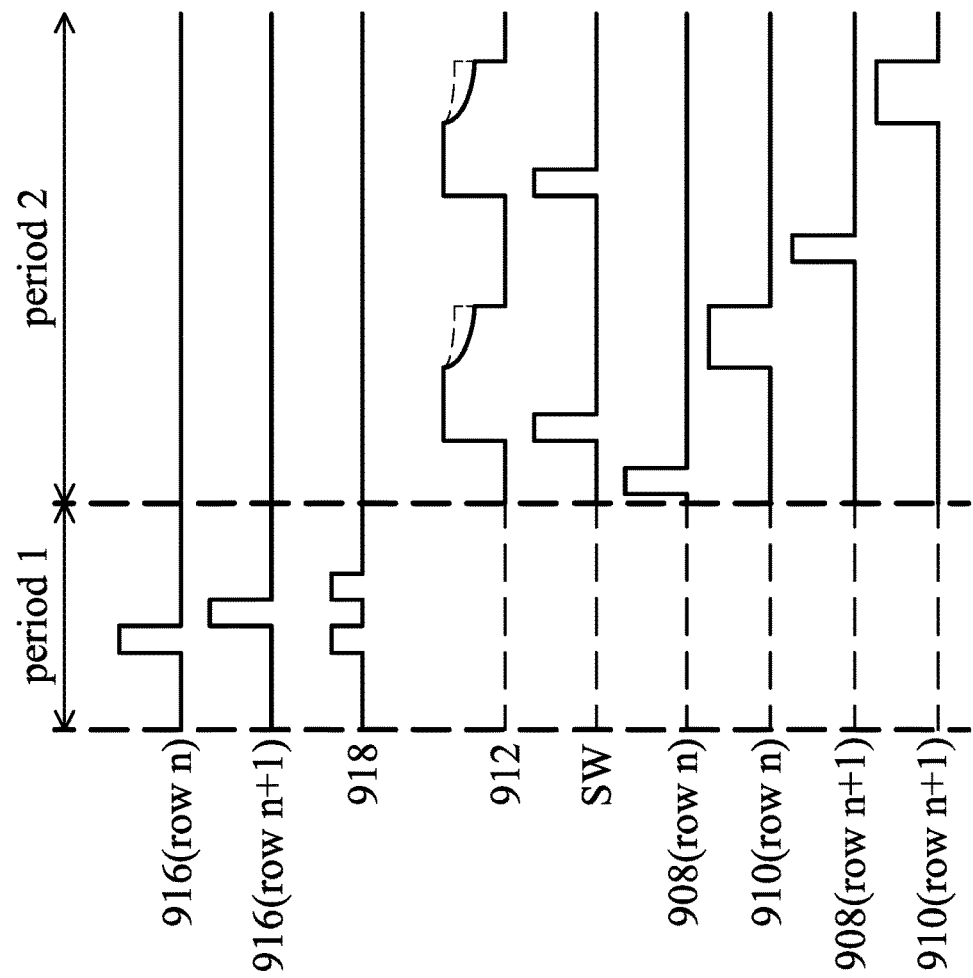
FIG. 10B is a timing diagram of the photo sensing of the array in FIG. 10A, in accordance with some embodiments of the present disclosure.

FIG. 10B is a timing diagram of the photo sensing of the array 900 in FIG. 10A. In order to prevent sensing errors by scattering or retardation caused by various liquid-crystal (LC) arrangements in the LCD, the display image could be changed to white or black before the DGTFTs 906 sense the light or object. As shown in FIG. 10B, in the period 1 (i.e., before the DGTFTs 906 start to sense the light or object), the line 916 in the row n is switched to "high voltage level" and the line 918 is switched to biased voltage level, so that the pixel in the row n is changed to white (or black). The line 916 in the row n+1 is then switched to "high voltage level" and the line 918 is switched to biased voltage level, so that the pixel in the row n+1 is changed to white (or black). Although only two rows (n, n+1) of array are shown in FIG. 10A, it should be understood that this operation can be repeatedly applied to all rows of the full array in the LCD, so that all pixels in the LCD are changed to white (or black).

In the period 2 (i.e., the DGTFTs 906 start to sense the light or object), the line 908 in the row n is switched to "high voltage level", so that the remaining charge in the DGTFT 906 in the row n can be removed. The switch SW is then switched to "high voltage level", so that the line 912 can be electrically connected to the reference voltage VREF (i.e., the line 912 is switched to "high voltage level"). Next, the line 910 in the row n is switched to "high voltage level", thereby the DGTFT 906 in the row n can sense the light or object. If the DGTFT 906 is irradiated by the light (e.g., the reflected light) reflected from the object, the threshold voltage (Vth) of the DGTFT 906 will be different. This Vth difference causes a leakage from line 912 to the line 914 via DGTFT 906 in the row n so that the voltage of line 912 drops due to the leakage. For example, as shown in FIG. 10B, the voltage of the line 912 may drop due to leakage of the DGTFT 906 in the row n. Since the Vth difference is affected by the different bright levels of the light, the leakage from the DGTFT 906 in the row n will also be different. This causes different drop amount of the voltage of line 912, as shown in FIG. 10B (solid line and dash line). The bright level of the light from the object can be detected by the DGTFT 906 in the row n. After the DGTFT 906 detection in the row n, DGTFT 906 detection in the row n+1 starts, and repeating the detection by each row in the same way. Therefore, the array 900 can sense the light and the object.

Figure 11:
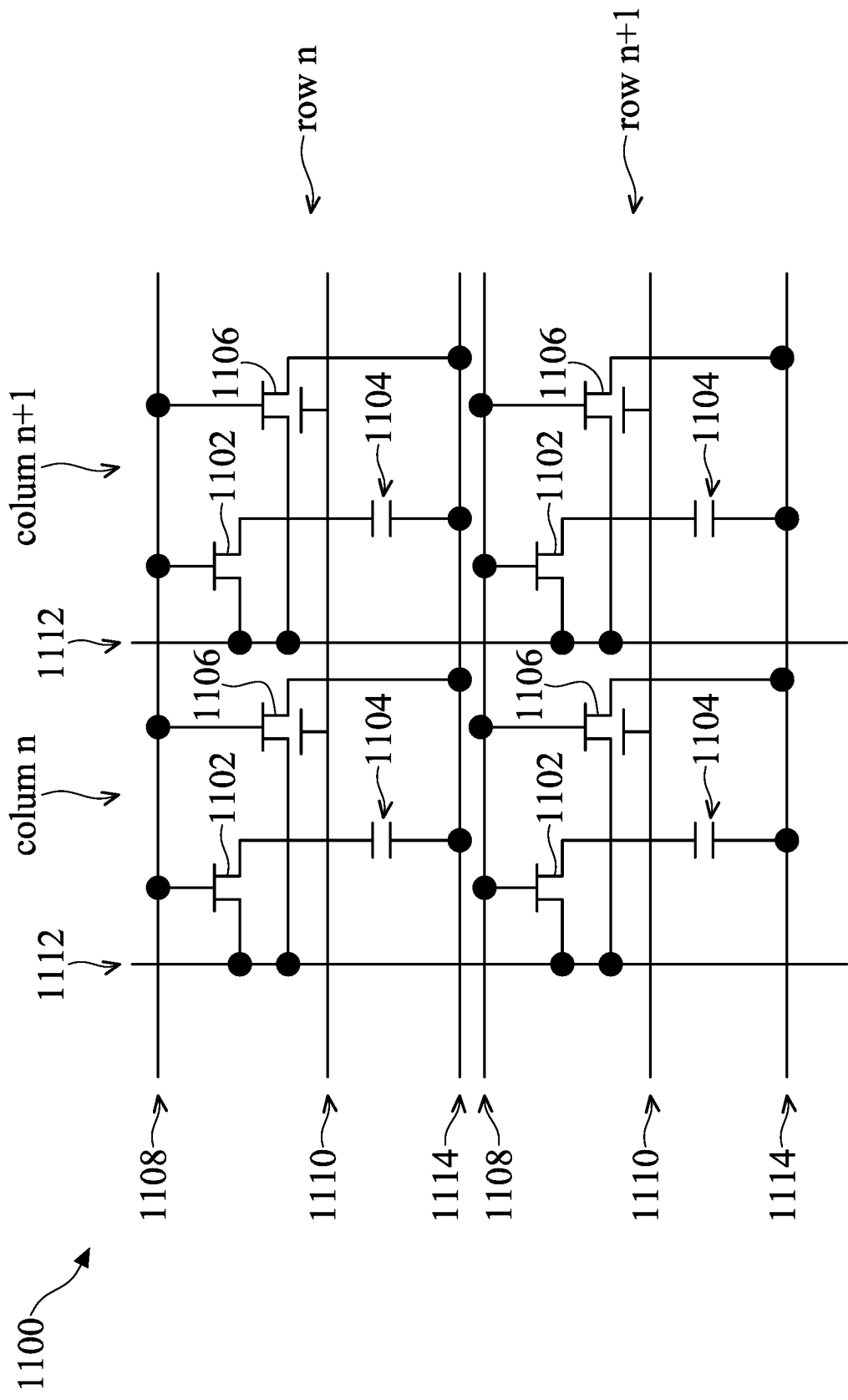
FIG. 11 illustrates a DGTFT array integrated into the TFT array of the display area in the LCD, in accordance with some embodiments of the present disclosure.

FIG. 11 illustrates a DGTFT array integrated into the TFT array of the display area in the LCD, in accordance with some embodiments of the present disclosure. For convenience, FIG. 11 merely shows a portion of the full array. The array 1100 includes four TFTs 1102, four capacitors 1104, and four DGTFTs 1106, arranged in column n, n+1 and row n, n+1 of the full array. Each of the DGTFTs 1106 is adjacent to one of the TFTs 1102. The top gate (metal layer) of the DGTFT 1106 is electrically connected to line 1108 (also called a top gate line), the bottom gate of the DGTFT 1106 is electrically connected to line 1110 (also called a bottom gate line), one source/drain terminal of the DGTFT 1106 is electrically connected to line 1112, and another source/drain terminal of the DGTFT 1106 is electrically connected to line 1114 (also called a common line). The DGTFTs 1106 in the same row are electrically connected to the same line 1108, line 1110, line 1114, and the DGTFTs 1106 in the same column are electrically connected to the same line 1112, as shown in FIG. 11. The gate of the TFT 1102 is electrically connected to line 1108, one source/drain terminal of the TFT 1102 is electrically connected to line 1112, and another source/drain terminal of the TFT 1102 is electrically connected to line 1114 by passing through one of the capacitors 1104. The TFTs 1102 in the same row are electrically connected to the same line 1108, line 1114, and the TFTs 1102 in the same column are electrically connected to the same line 1112, as shown in FIG. 11.

As shown in FIG. 11, the gate of the TFT 1102 and the top gate of the DGTFT 1106 adjacent to the TFT 1102 in the same row are electrically connected to the same line 1108. In other words, the gate of the TFT 1102 connects to the top gate (e.g., the metal layer 212) of the DGTFT 1106 adjacent to the TFT 1102. One source/drain terminal of the TFT 1102 and one source/drain terminal of the DGTFT 1106 adjacent to the TFT 1102 are electrically connected to the same line 1112. In other words, one source/drain terminal of the TFT 1102 is electrically connected to one source/drain terminal of the DGTFT 1106 adjacent to the TFT 1102. The line 1108 can be called a gate line (for TFT) or a top gate line (for DGTFT). The line 1112 can be called a data line (for TFT) or a readout line (for DGTFT). Using this arrangement, the array 1100 can be used as a display device and can sense light or objects (e.g., a fingerprint pattern).

Figure 12A:
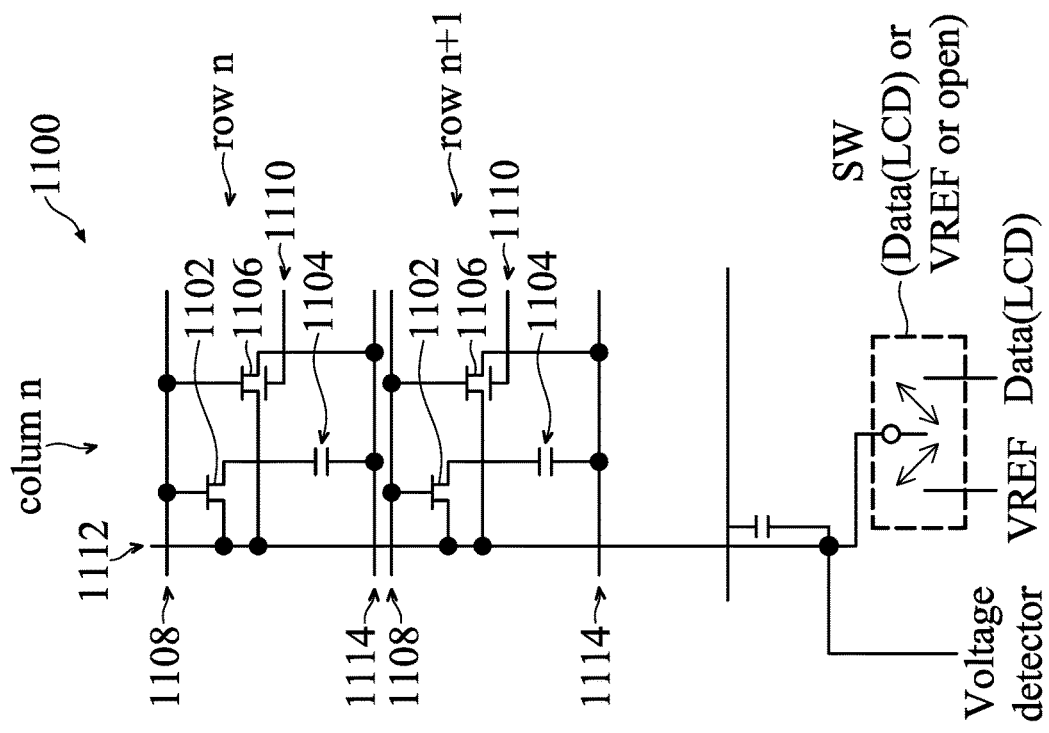
FIG. 12A illustrates a portion of the array in FIG. 11, in accordance with some embodiments of the present disclosure.

FIG. 12A illustrates a portion of the array in FIG. 11, in accordance with some embodiments of the present disclosure. For convenience, two TFTs 1102, two capacitors 1104, and two DGTFTs 1106 arranged in column n and rows n, n+1. As shown in FIG. 12A, one source/drain terminal of the TFT 1102 and the DGTFT 1106 are electrically connected to a reference voltage VREF or data voltage of LCD by the line 1112 and the switch SW in the same row. The voltage of the line 1114 is the same as the ground (GND). The DGTFT 1106 should be turned off (e.g., the voltage of the bottom gate of the DGTFT 1106 is −10V) in the operating period of the TFT 1102, so the line 1114 and the line 1112 are not electrically connected.

Figure 12B:
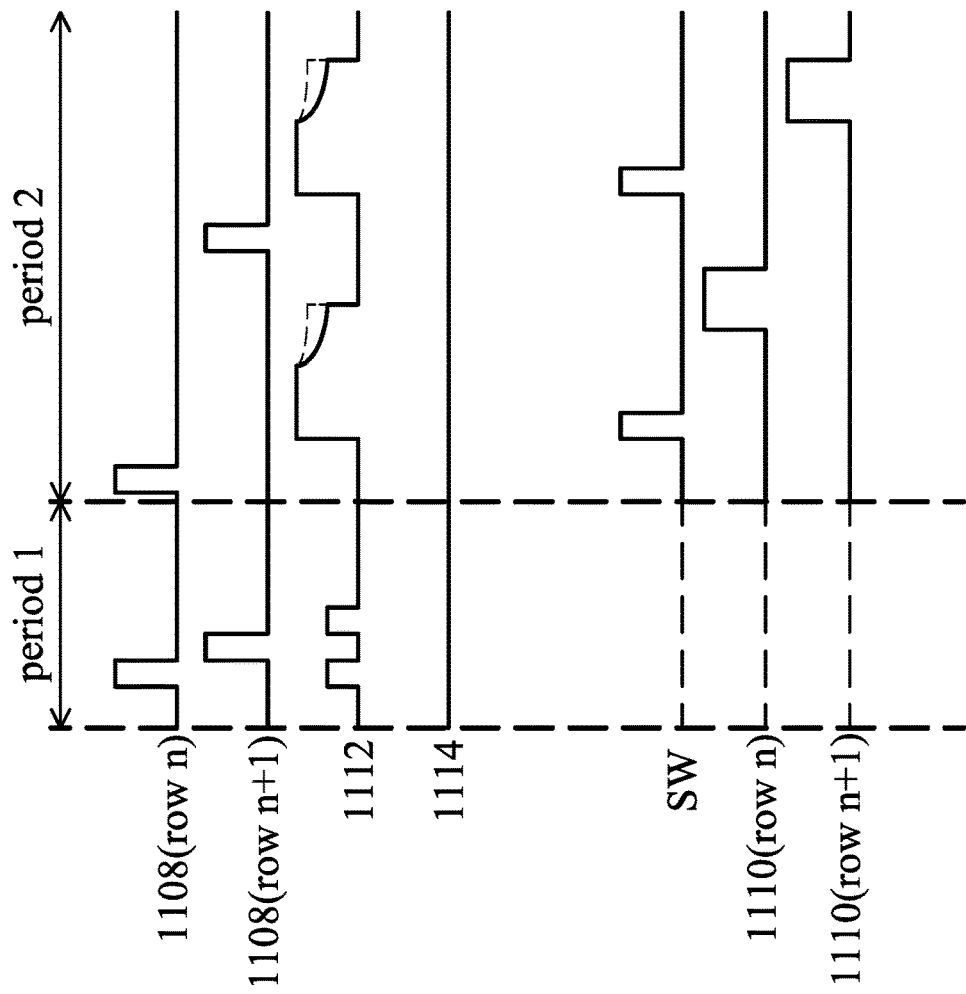
FIG. 12B is a timing diagram of the photo sensing of the array in FIG. 11A, in accordance with some embodiments of the present disclosure.

FIG. 12B is a timing diagram of the photo sensing of the array 1100 in FIG. 12A. As shown in FIG. 12B, in the period 1 (i.e., before the DGTFTs 1106 start to sense the light or object), the line 1108 in the row n is switched to "high voltage level" and the line 1112 is switched to "biased voltage level", so that the pixel in the row n is changed to white (or black). The line 1108 in the row n+1 is then switched to "high voltage level" and the line 1112 is switched to "biased voltage level", so that the pixel in the row n+1 is changed to white (or black). The line 1114 is maintained in "low" (e.g., in GND). The line 1110 is maintained in "low" to turn off the DGTFT 1106, such that the line 1114 does not electrically connect to the line 1112 through the DGTFT 1106, as discussed above. Although only two rows (n, n+1) of array are shown in FIG. 12A, it should be understood that this operation can be repeatedly applied to all rows of the full array in the LCD, so that all pixels in the LCD are changed to white (or black).

In the period 2 (i.e., the DGTFTs 1106 start to sense the light or object), the line 1108 in the row n is switched to "high voltage level", so that the remaining charge in the DGTFT 1106 in the row n can be removed. The switch SW is then switched to "high voltage level", so that the line 1112 can be electrically connected to the reference voltage VREF. Next, the line 1110 in the row n is switched to "high voltage level", and thereby the DGTFT 1106 in the row n can sense the light or object. If the DGTFT 1106 is irradiated by the light (e.g., the reflected light) from the object, the threshold voltage (Vth) of the DGTFT 1106 in the row n will be different. This Vth difference causes a leakage from line 1112 to the line 1114 via DGTFT 1106 in the row n, so that the voltage of line 1112 drops due to the leakage. For example, as shown in FIG. 12B, the voltage of line 1112 may drop because of the leakage from the DGTFT 1106 in the row n. Since the Vth difference is affected by the different bright levels of the light, the leakage of the DGTFT 1106 in the row n will also be different. Then, this causes different drop amount of the voltage of line 1112, as shown in FIG. 12B (solid line and dash line). The bright level of the light from the object can be detected by the DGTFT 1106 in the row n. After the DGTFT 1106 detection in the row n, DGTFT 1106 detection in the row n+1 starts, and repeating the detection by each row in the same way. Therefore, the array 1100 can sense the light and the object.

Figure 13:
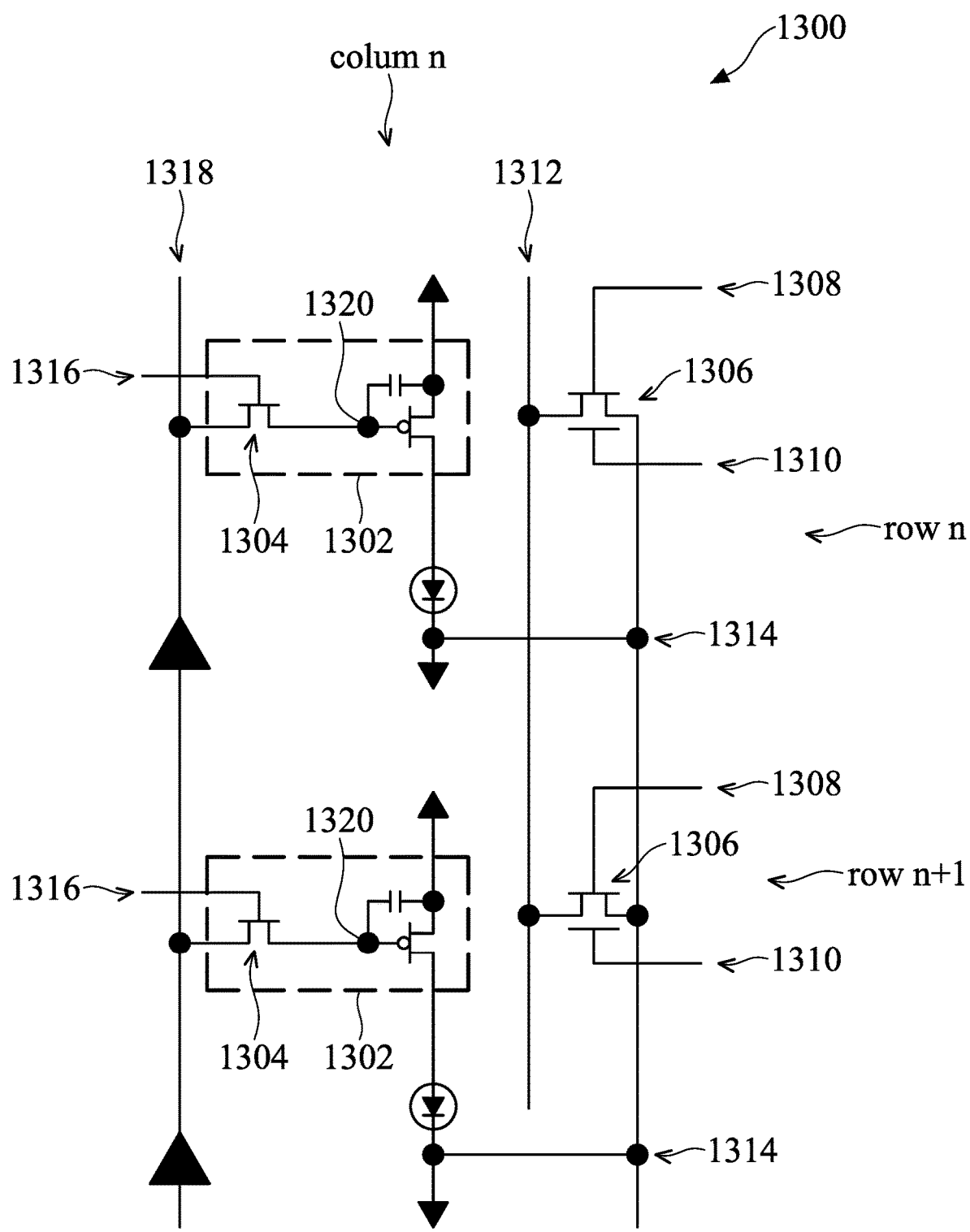
FIG. 13 illustrates a DGTFT array integrated into the array of the display area in the OLED, in accordance with some embodiments of the present disclosure.

FIG. 13 illustrates a DGTFT array integrated into the array of the display area in the LED, in accordance with some embodiments of the present disclosure. For convenience, FIG. 13 merely shows a portion of the full array. The array 1300 includes two display cells 1302 and two DGTFTs 1306, arranged in column n and rows n, n+1 of the full array. The display cell 1302 includes a TFT 1304. Each of the DGTFTs 1306 is adjacent to one of the display cells 1302 (or one of the TFTs 1304). The top gate of the DGTFT 1306 is electrically connected to line 1308 (also called a top gate line), the bottom gate of the DGTFT 1306 is electrically connected to line 1310 (also called a bottom gate line), one source/drain terminal of the DGTFT 1306 is electrically connected to line 1312 (also called a readout line), and another source/drain terminal of the DGTFT 1306 is electrically connected to node 1314. The node 1314 is electrically connected to ground (GND). The DGTFTs 1306 in the same row are electrically connected to the same line 1308 and line 1310 (not shown), and the DGTFTs 1306 in the same column are electrically connected to the same line 1312, as shown in FIG. 13. The gate of the TFT 1304 is electrically connected to line 1316 (also called a gate line), one source/drain terminal of the TFT 1304 is electrically connected to line 1318 (also called a data line), and another source/drain terminal of the TFT 1304 is coupled to node 1320. The display cell 1302 in the same row are electrically connected to the same line 1316 (not shown), and the display cell 1302 in the same column is electrically connected to the same line 1318, as shown in FIG. 13. Using the arrangement in this embodiment, the array 1300 can be used as a display device and can sense light and objects (e.g., a fingerprint pattern).

Figures 14A, 14B:
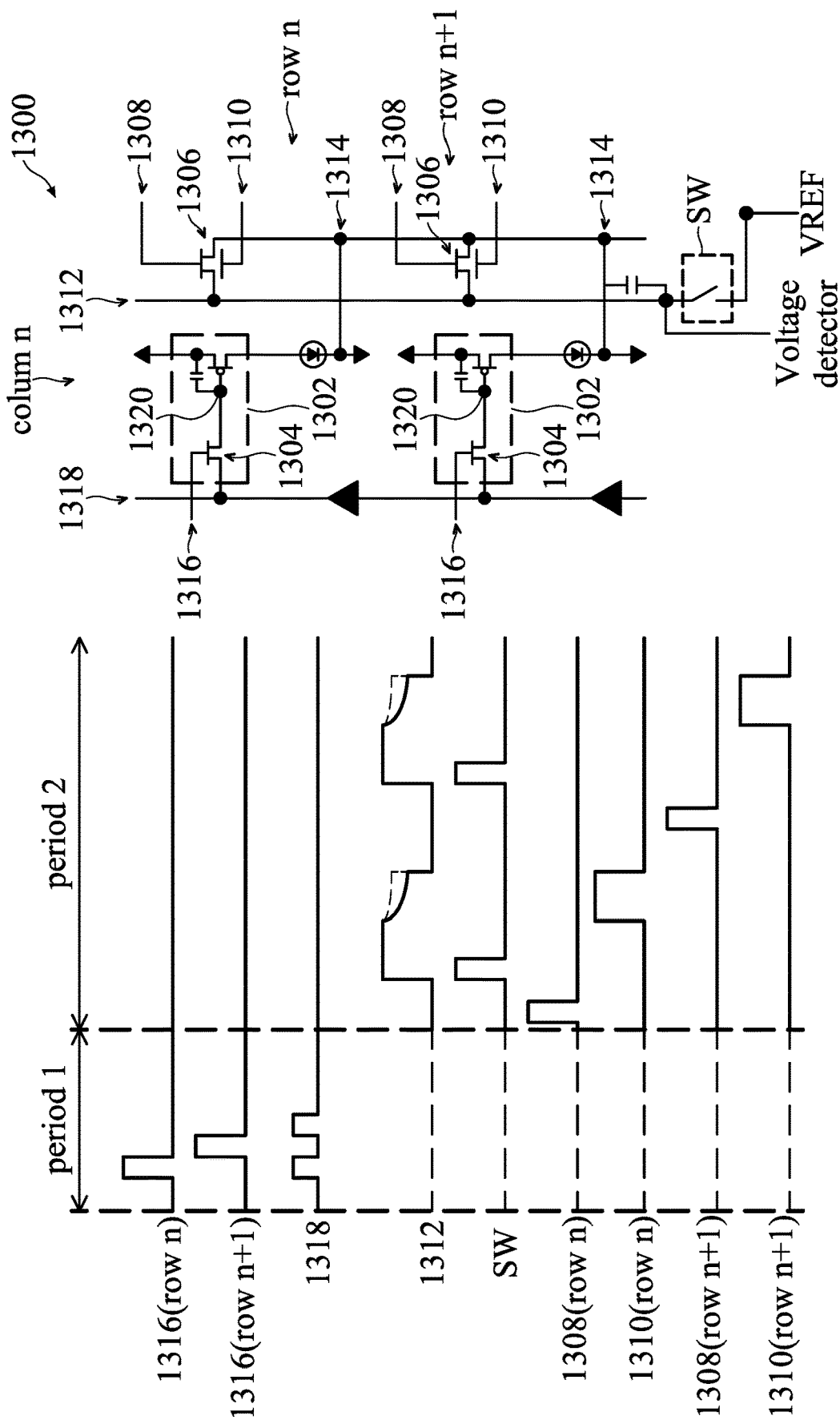
FIG. 14A illustrates the array in FIG. 13, in accordance with some embodiments of the present disclosure.
FIG. 14B is a timing diagram of the photo sensing of the array in FIG. 14A, in accordance with some embodiments of the present disclosure.

FIG. 14A illustrates the array in FIG. 13, in accordance with some embodiments of the present disclosure. As shown in FIG. 14A, one source/drain terminal of the DGTFT 1306 is electrically connected to a reference voltage VREF by the line 1312 and the switch SW. The TFT 1304 for LED can be turned off by applying a gate OFF voltage (e.g., −10V) to the line 1316. The line 1312 is electrically connected to the node 1314 when an ON voltage (e.g., +5V) is applied to the top gate of the DGTFT 1306. The line 1312 becomes floating when an OFF voltage (e.g., −10V) is applied to the top gate of the DGTFT 906. The line 1312 is also electrically connected to the voltage detector (or the voltage detector and a buffer circuit) via the voltage measurement line. In this embodiment, an ON voltage (e.g., +15V) is applied to the bottom gate of the DGTFT 1306 when the DGTFT 1306 senses the object (e.g., a fingerprint pattern).

FIG. 14B is a timing diagram of the photo sensing of the array 1300 in FIG. 14A. In this embodiment, as shown in FIG. 14B, in the period 1 (i.e., before the DGTFTs 1306 start to sense the light or object), the line 1316 in the row n is switched to "high voltage level" and the line 1318 is switched to "biased voltage level", so that the pixel in the row n is changed to white. The line 1316 in the row n+1 is then switched to "high voltage level" and the line 1318 is switched to "biased voltage level", so that the pixel in the row n+1 is changed to white. Although only two rows (n, n+1) of array are shown in FIG. 14A, it should be understood that this operation can be repeatedly applied to all rows of the full array in the LED, so that all pixels in the LED are changed to white.

In the period 2 (i.e., the DGTFTs 1306 start to sense the light or object), the line 1308 in the row n is switched to "high voltage level", so that the remaining charge in the DGTFT 1306 in the row n can be removed. The switch SW is then switched to "high voltage level", so that the line 1312 can be electrically connected to the reference voltage VREF. Next, the line 1310 in the row n is switched to "high voltage level", thereby the DGTFT 1306 in the row n can sense the light or object. If the DGTFT 1306 is irradiated by the light (e.g., the reflected light) from the object, the threshold voltage (Vth) of the DGTFT 1306 will be different. This Vth difference causes a leakage from line 1312 to the node 1314 (electrically connected to ground (GND)) via DGTFT 1306 in the row n, so that the voltage of line 1312 drops due to the leakage. For example, as shown in FIG. 14B, the voltage of the line 1312 may drop due to leakage of the DGTFT 1306 in the row n. Since the Vth difference is affected by the different bright levels of the light, the leakage of the DGTFT 1306 in the row n will also be different. Then, this causes different drop amount of the voltage of line 1312, as shown in FIG. 14B (solid line and dash line). The bright level of the light from the object can be detected by the DGTFT 1306 in the row n. After the DGTFT 1306 detection in the row n, DGTFT 1306 detection in the row n+1 starts, and repeating the detection by each row in the same way. Therefore, the array 1300 can sense the light and the object.

Figure 15:
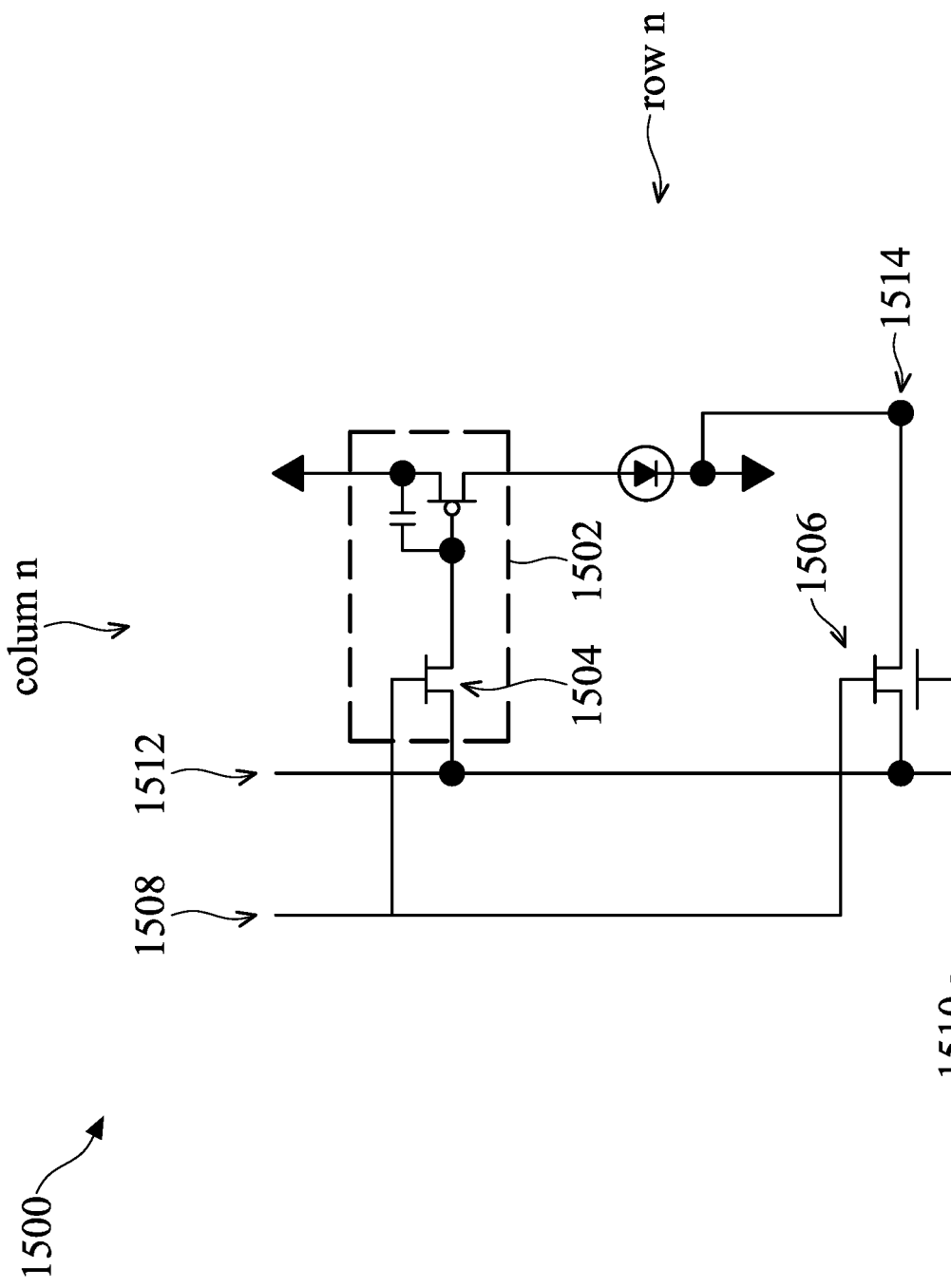
FIG. 15 illustrates a DGTFT array integrated into the TFT array of the display area in the OLED, in accordance with some embodiments of the present disclosure.

FIG. 15 illustrates a DGTFT array integrated into the TFT array of the display area in the LED, in accordance with some embodiments of the present disclosure. For convenience, FIG. 15 merely shows a portion of the full array. The array 1500 includes a display cell 1502 and a DGTFT 1506, arranged in column n and row n of the full array. The display cell 1502 includes a TFT 1504. The DGTFT 1506 is adjacent to one of the display cells 1502 (or one of the TFTs 1504). The top gate of the DGTFT 1506 is electrically connected to line 1508 (also called a top gate line), the bottom gate of the DGTFT 1506 is electrically connected to line 1510 (also called a bottom gate line), one source/drain terminal of the DGTFT 1506 is electrically connected to line 1512, and another source/drain terminal of the DGTFT 1506 is electrically connected to node 1514. The node 1514 is electrically connected to ground (GND). The gate of the TFT 1504 is electrically connected to the line 1508, one source/drain terminal of the TFT 1504 is electrically connected to line

1512, and another source/drain terminal of the TFT 1504 is coupled to node 1514 through the LED device.

As shown in FIG. 15, the gate of the TFT 1504 and the top gate of the DGTFT 1506 adjacent to the TFT 1504 are electrically connected to the same line 1508. In other words, the gate of the TFT 1504 connects to the top gate of the DGTFT 1506 adjacent to the TFT 1504. One source/drain terminal of the TFT 1504 and one source/drain terminal of the DGTFT 1506 adjacent to the TFT 1504 are electrically connected to the same line 1512. In other words, one source/drain terminal of the TFT 1504 electrically connects to one source/drain terminal of the DGTFT 1506 adjacent to the TFT 1504. The line 1508 can be called a gate line (for TFT) or a top gate line (for DGTFT). The line 1512 can be called a data line (for TFT) or a readout line (for DGTFT). Using this arrangement, the array 1500 can be used as a display device and can sense light and objects (e.g., a fingerprint pattern).

FIG. 16A illustrates a portion of the full array of the LED, in accordance with some embodiments of the present disclosure. For convenience, two display cells 1502, two TFT 1504, and two DGTFTs 1506 arranged in column n and row n, n+1. As shown in FIG. 16A, one source/drain terminal of the TFT 1504 and the DGTFT 1506 are electrically connected to a reference voltage VREF or data voltage of LED by the line 1512 and the switch SW. The node 1514 is electrically connected to ground (GND), as discussed above. The DGTFT 1506 should be turned off (e.g., the voltage of the bottom gate of the DGTFT 1506 is −10V) in the operating period of the TFT 1504, so the node 1514 and the line 1512 are not electrically connected.

FIG. 16B is a timing diagram of the photo sensing of the array 1500 in FIG. 16A. As shown in FIG. 16B, in the period 1 (i.e., before the DGTFTs 1506 start to sense the light or object), the line 1508 in the row n is switched to "high voltage level" and the line 1512 is switched to "biased voltage level", so that the pixel in the row n is changed to white. The line 1508 in the row n+1 is then switched to "high voltage level" and the line 1512 is switched to "biased voltage level", so that the pixel in the row n+1 is changed to white. The node 1514 is maintained in "low" (e.g., in GND). The line 1510 is maintained in "low" to turn off the DGTFT 1506, such that the line 1514 does not electrically connect to the line 1512 through the DGTFT 1506, as discussed above. Although only two rows (n, n+1) of array are shown in FIG. 16A, it should be understood that this operation can be repeatedly applied to all rows of the full array in the LED, so that all pixels in the LED are changed to white.

In the period 2 (i.e., the DGTFTs 1506 start to sense the light or object), the line 1508 in the row n is switched to "high voltage level", so that the remaining charge in the DGTFT 1506 in the row n can be removed. The switch SW is then switched to "high voltage level", so that the line 1512 can be electrically connected to the reference voltage VREF. Next, the line 1510 in the row n is switched to "high voltage level", thereby the DGTFT 1506 in the row n can sense the light or object. If the DGTFT 1506 is irradiated by the light (e.g., the reflected light) from the object, the threshold voltage (Vth) of the DGTFT 1506 will be different. This Vth difference causes a leakage from line 1512 to the node 1514 (electrically connected to ground (GND)) via DGTFT 1506 in the row n, so that the voltage of line 1512 drops due to the leakage. For example, as shown in FIG. 16B, the voltage of line 1512 may drop due to leakage from the DGTFT 1506 in the row n. Since the Vth difference is affected by the different bright levels of the light, the leakage of the DGTFT 1506 in the row n will also be different. Then, this causes different drop amount of the voltage of line 1512, as shown in FIG. 16B (solid line and dash line). The bright level of the light from the object can be detected by the DGTFT 1506 in the row n. After the DGTFT 1506 detection in the row n, DGTFT 1506 detection in the row n+1 starts, and repeating the detection by each row in the same way. Therefore, the array 1500 can sense the light and the object.

It should be noted that the operation of the top gate and bottom gate of the DGTFT (i.e. the voltage applied to the top gate and bottom gate of the DGTFT) for sensing can be exchanged. In other words, the bottom gate of the DGTFT can be switched to "high voltage level" for removing the remaining charge in the DGTFT and the top gate of the DGTFT can be switched to "high voltage level" for the DGTFT to sense light or an object. Furthermore, the TFTs and the DGTFTs in the embodiments of FIGS. 9-16 as discussed are n-channel type. However, in other embodiments, it should be understood that p-channel type TFTs and DGTFTs can be applied.

The terminology used herein is for the purpose of describing particular embodiments only, and is not intended to be limiting of the invention. As used herein, the singular forms "a", "an" and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore terms, such as those defined in commonly used dictionaries, should be interpreted as having a meaning that is consistent with their meaning in the context of the relevant art, and will not be interpreted in an idealized or overly formal sense unless expressly so defined herein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising a plurality of double gate thin film transistors (DGTFT), wherein the plurality of DGTFTs comprises a first DGTFT, the first DGTFT comprising:
   a substrate;
   a first transparent conductive layer, disposed above the substrate;
   a first metal layer, disposed corresponding to the first transparent conductive layer, wherein the first metal layer is electrically connected to the first transparent conductive layer; and
   a channel layer, disposed corresponding to the first transparent conductive layer,
   wherein the first metal layer extends beyond at least one of the boundaries of the channel layer, and wherein the channel layer comprises a poly-silicon material layer.

2. The electronic device as claimed in claim 1, wherein the first DGTFT further comprises:
an insulating layer having an opening, in which a part of the first transparent conductive layer is exposed.

3. The electronic device as claimed in claim 2, wherein the first metal layer further extends in the opening to form an opening region.

4. The electronic device as claimed in claim 3, wherein further comprises:
an opaque material layer, disposed above the first transparent conductive layer, wherein the opaque material layer does not overlap the opening region in the top view of the electronic device.

5. The electronic device as claimed in claim 4, wherein further comprises:
a passivation layer, disposed between the opaque material layer and the first metal layer.

6. The electronic device as claimed in claim 3, wherein an angle of an extending direction of the first metal layer extending in the opening is greater than or equal to 85 degrees, and is less than or equal to 95 degrees, with respect to the first transparent conductive layer.

7. The electronic device as claimed in claim 6, wherein the angle is greater than or equal to 85 degrees, and is less than or equal to 90 degrees.

8. The electronic device as claimed in claim 3, further comprising:
a second DGTFT of the plurality of DGTFTs, adjacent to the first DGTFT, wherein the second DGTFT comprises:
a second transparent conductive layer, disposed above the substrate; and
the first metal layer, disposed corresponding to the second transparent conductive layer and at least partially overlapped the second transparent conductive layer in the top view of the electronic device.

9. The electronic device as claimed in claim 8, further comprises:
a second metal layer, disposed in the insulating layer and positioned between the first DGTFT and the second DGTFT.

10. The electronic device as claimed in claim 8, further comprising:
a differential subtractor circuit, wherein a terminal of the second DGTFT and a terminal of the first DGTFT adjacent to the second DGTFT are electrically connected to the differential subtractor circuit.

11. The electronic device as claimed in claim 3, wherein the plurality of DGTFTs further comprises an another first DGTFT adjacent to the first DGTFT, wherein a length in a direction of the opening region of the first DGTFT and the length in the direction of the opening region of the another first DGTFT are different.

12. The electronic device as claimed in claim 11, further comprising:
a comparator circuit, wherein a terminal of the first DGTFT and a terminal of the another first DGTFT are electrically connected to the comparator circuit.

13. The electronic device as claimed in claim 1, wherein the first metal layer has a reflectivity lower than 60% to visible light.

14. The electronic device as claimed in claim 1, wherein the first metal layer comprises a chromium material.

15. The electronic device as claimed in claim 1, further comprising:
at least one thin film transistor (TFT), adjacent to the first DGTFT.

16. The electronic device as claimed in claim 15, wherein a terminal of the at least one TFT connects to a terminal of the first DGTFT adjacent to the TFT.

17. The electronic device as claimed in claim 16, wherein a gate of the at least one TFT connects to the first metal layer of the first DGTFT adjacent to the TFT.

* * * * *